US006782610B1

(12) United States Patent
Iijima et al.

(10) Patent No.: US 6,782,610 B1
(45) Date of Patent: Aug. 31, 2004

(54) METHOD FOR FABRICATING A WIRING SUBSTRATE BY ELECTROPLATING A WIRING FILM ON A METAL BASE

(75) Inventors: Tomoo Iijima, Tokyo (JP); Masayuki Oosawa, Tokyo (JP); Shigeo Hirade, Tokyo (JP)

(73) Assignee: North Corporation, Tokyo (JP)

( * ) Notice: Subject to any disclaimer, the term of this patent is extended or adjusted under 35 U.S.C. 154(b) by 0 days.

(21) Appl. No.: 09/466,895

(22) Filed: Dec. 20, 1999

(30) Foreign Application Priority Data

May 21, 1999 (JP) .......................................... 11-141676
Aug. 13, 1999 (JP) .......................................... 11-229140

(51) Int. Cl.[7] .............................................. H01R 43/00
(52) U.S. Cl. .............................. 29/827; 29/846; 29/848; 29/852; 438/123; 438/125; 438/126; 438/127; 438/111; 438/112; 216/14; 257/676; 205/125
(58) Field of Search ........................... 29/843, 842, 846, 29/844, 845, 827, 848, 852; 438/123, 125, 126, 127, 111, 112; 257/673, 712, 778, 676; 437/209, 211, 214, 217, 218, 219; 216/14; 361/813; 205/122–123, 125

(56) References Cited

U.S. PATENT DOCUMENTS

| 4,135,295 | A | * | 1/1979 | Price ........................... 29/623 |
| 4,209,355 | A | * | 6/1980 | Burns .......................... 156/630 |
| 5,027,188 | A | * | 6/1991 | Owada et al. ................. 357/68 |
| 5,481,798 | A | * | 1/1996 | Ohsawa ........................ 29/827 |
| 5,602,059 | A | * | 2/1997 | Horiuchi et al. ............. 437/209 |
| 5,662,755 | A | * | 9/1997 | Miura et al. .................. 156/89 |
| 5,663,106 | A | * | 9/1997 | Karavakis et al. ............. 29/841 |
| 5,686,702 | A | * | 11/1997 | Ishida ......................... 174/250 |
| 5,728,599 | A | * | 3/1998 | Rostoker et al. ............. 437/182 |
| 5,756,377 | A | * | 5/1998 | Ohsawa ....................... 438/111 |
| 5,901,436 | A | * | 5/1999 | Ohsawa et al. ................ 216/14 |
| 6,020,626 | A | * | 2/2000 | Ohsawa et al. .............. 257/668 |
| 6,258,631 | B1 | * | 7/2001 | Ito et al. ...................... 438/123 |
| 6,280,858 | B1 | * | 8/2001 | Teshima ...................... 428/639 |

FOREIGN PATENT DOCUMENTS

| JP | 5563857 | * | 5/1980 |
| JP | 57188859 | * | 11/1982 |
| JP | 2215144 | * | 2/1990 |
| JP | 637151 | * | 6/1994 |
| JP | 1154668 | * | 2/1999 |
| JP | 11204680 | * | 11/1999 |

* cited by examiner

Primary Examiner—Richard Chang
(74) Attorney, Agent, or Firm—Armstrong, Kratz, Quintos, Hanson & Brooks, LLP

(57) ABSTRACT

The present invention relates to a method for fabricating a wiring substrate by forming an insulating film on a metal base having openings on the metal base at positions corresponding to metal bumps to be formed later; forming at least one layer of wiring on the base made of a metal through the insulating film, the layer of wiring having a wring film formed thereon by electroplating; and selectively etching the base. The insulating film can be a liquid photosensitive polyamide, the wiring layer can be copper and the wiring film can be a conductive layer selected from the group consisting of Ni-P and Ni. In the present invention, the wiring layer can be formed through the insulating film in contact with the metal base at the openings in the insulating film and in contact with the insulating film where there are no openings in the insulating film.

4 Claims, 33 Drawing Sheets

| | BALL STRUCTURE | THE NUMBER OF LEADS BETWEEN ADJACENT BALLS 0.5mm PITCH | DIAMETRE OF OPENING | WIRING(L/S) |
|---|---|---|---|---|
| | BASE METAL | 6 LINES | 50 μ | 30/30 μ |
| | PLATING BALL | 5 LINES | 100 μ | 30/30 μ |
| | POST-ATTACHMENT SOLDER BALL | 1 LINE OR 2 LINES | 300 μ | 30/30 μ |

METHOD FOR FABRICATING A WIRING SUBSTRATE BY ELECTROPLATING A WIRING FILM ON A METAL BASE

BACKGROUND OF THE INVENTION

1. Field of the Invention

The present invention relates to a wiring substrate for mounting semiconductor elements and a fabricating method thereof.

2. Description of Related Art

As a wiring substrate for mounting semiconductor elements, which an LSI (Large Scale Integrated) chip is mounted, which is connected to a printed wiring, etc., and which is called, for example, an interposer for mounting semiconductor elements, there are two kinds of wiring substrates: one with a resin base such as a polyimide film, and the other with a metal base such as copper. Here, a description will be given on a fabricating method of the wiring substrate with a polyimide film base.

A polyimide film is prepared as a base, and a thin copper film having a thickness of about, for example, 0.2 $\mu$m is formed on each main surface of the base by, for example, sputtering. Next formed by drill machining or press working is a through hole for connecting to one another wiring films that are to be formed on those main surfaces. Thereafter, a copper film with a thickness of about, for example, 5 $\mu$m is formed by electroless plating on the surface of each of the above thin copper films. A resist film for patterning is further formed on this copper film placed on each surface of the base, and a copper wiring film (with a thickness of 30 $\mu$m, for example) is formed on each of the copper film by electroplating while using the resist films as masks. With this, one of the copper wiring films, which is the one formed on the front side of the base constitutes a normal circuit wiring and the other one formed on the back side of the base constitutes a ground line and a power source, line.

After removing the resist films used as masks, then removed by soft etching of copper are the thin copper films that have been formed over the entire surfaces as under films upon formation of the copper wiring films prior to the formation of the above resist films. By this removal, the copper wiring films are no longer electrically short-circuited with the thin copper films, resulting in copper wiring films that are independent of each other.

An insulating resin film is next applied to the front side surface and is patterned through exposure and development so that openings are formed in a portion where a solder ball is to be formed and a portion to be joined with an LSI. After that, the base is selectively etched from its back side to expose a portion of the copper wiring film, which is to be joined with the LSI, to enhance by, for example, gold electroless plating the connectivity of the copper wiring film surface to the ball electrode such as the solder ball or to the LSI. Thus fabricated is the wiring substrate called the interposer.

The above wiring substrate is bonded at its back surface side to an LSI chip through a buffer adhesive, and then lead ends of the copper wiring film are micro-joined with electrodes of the LSI chip. After sealing the micro-joined portion with a resin, one of the copper wiring films, which to on the opposite side of the base to the LSI chip, is plated, and the solder ball is mounted on a portion exposed to the opening of the insulating resin film. The solder ball is then shaped by reflowing.

Subsequently, a description will be made on a method of fabricating a conventional wiring substrate of the type with a metal base, such as copper. A base made of, for example, copper and having a thickness of about, for example, 100 to 200 $\mu$m is prepared. A resist film is formed so as to have a pattern negative to the pattern of a copper wiring film to be formed. Using this resist film as a mask, a thin gold film is formed by electroplating on one surface of the copper base, and the wiring film is then formed by electroplating of the copper film. On a region where this wiring film is formed, an insulating film having an opening in a portion to form a ball electrode and having a pattern that does not cover a portion of the wiring film, which is used as electrodes of an LSI chip, is formed. After the ball electrode is formed from, for example, nickel or gold by plating in the opening portion of this insulating film, the base, except for its periphery, is removed by selective etching from the back surface side to expose the back surface side of the wiring film. Thus, the wiring substrate called the interposer is fabricated. This wiring substrate is bonded at its back surface side to the LSI chip through a buffer adhesive, leads of the wiring film are connected to electrodes of the LSI chip, and the substrate is sealed with resin, thereby completing the mounting of the LSI chip.

Wiring substrates of the type with a polyimide film base generally have problems as follows. First, when circuits are formed on both surfaces of the base and are connected to each other to obtain a two-layer circuit with the aim of high integration, mechanical punching out is required. The hole punched out has to be minute as high integration and to downsizing of the substrate are taken, which is likely to make it difficult to connect to one another the circuits in the two-layer circuit. In addition, processing accuracy (about position and shape) of the hole, a final package outer shape and ball position accuracy are not easily be enhanced, and hence it is becoming more and more difficult to achieve the accuracy demanded.

Also, having the base of a polyimide film, the wiring substrate is hard to have sufficiently enhanced physical strength upon completion as a circuit board. Therefore, it can not avoid a problem of high likelihood of deformation, etc., at the packaging process.

Further, since the polyimide film forming the base is an insulating material and it is difficult to apply electric potential, it makes electroplating virtually impossible. This brings about another problem of the solder ball being required to be mounted in post-attachment at the packaging process. Namely, because of extremely poor adherence related to the joining strength between solder and copper, a very large area has to be saved for the solder ball mounting portion in the wiring film in order to prevent a defeat of ball falling off. This leads to a reduced number of wirings that are allowed to thread through (be formed between) the solder balls adjacent to one another in the arrangement pitch of the solder balls, which gives rise to still another problem by being a great cause for blocking high integration.

In order to improve reliability against falling off of the ball, which is judged in the temperature cycle test performed after the balls are mounted to the substrate, an area allotted for every solder ball needs to be large. For that reason, the number of wirings running through (formed between) the balls is restricted, presenting still another problem of putting limitation on design in which densification is intended by increasing the number of the balls.

The polyimide film forming the base also serves as a carrier in the fabrication. The film is thus not easy to form thinner, making it hard to lower the usage amount and cost of the material, and further brings about a problem of poor connectivity between the circuits on both surfaces. Still further, the thick polyimide film absorbs a lot of moisture, causing the package crack at the time of mounting.

Therefore, a wiring substrate using as the base a metal instead of the polyimide film has been developed. The wiring substrate as such does solve a portion of the above-described problems inherent in the wiring substrate using the polyimide film as the base, but that conventional wiring substrate is not yet free from problems. That is, since the base to formed from a metal, in order to form a circuit on its surface by electroplating, it is required to remove most of the metal forming its base by selective etching from the back surface. The substrate therefore should take a considerably complicated ma structure in the case of forming the two-layer wiring circuit. Further, when the whole base under the wiring film is removed, the substrate is weak to the deformation from the viewpoint of film strength, and is difficult to mount.

In addition, enhancement of mounting density is demanded for the wiring substrates described above. This mounting density may be remarkably enhanced if the LSI chip is mounted on the main surface on each side of the wiring substrate, or if a plurality of wiring substrates with the LSI chips mounted thereto are layered. However, that has not been an easily accomplished work in prior art.

SUMMARY OF THE INVENTION

The present invention has been made to solve those problems and, therefore, an object of the present invention is to strengthen the rigidity of a wiring substrate for mounting semiconductor elements, to prevent shrinkage due to temperature shift based on the difference in coefficient of thermal expansion between a wiring film and an insulating film made of a resin, to enhance, by making it possible to form terminals such as the wiring film and a ball electrode through electroplating, its film quality and stability and, further, to connect a base with the wiring film so that the base may be utilized as a ground line, a power source line, etc.

Another object of the present invention is to provide a wiring substrate for mounting semiconductor elements to which an LSI chip may be mounted on the main surface of each side, and to make it possible to layer on one another a plurality of wiring substrates for mounting semiconductor elements each having the LSI chip mounted thereto.

According to the present invention, there is provided a wiring substrate comprising: a base made of a metal; and at least one layer wiring formed on the base through an insulating film, the layer wiring having a wiring film formed by electroplating, wherein the base is selectively etched.

According to the present invention, there is provided a method for fabricating a wiring substrate comprising the steps of: forming at least one layer wiring on a base made of a metal through an insulating film, the layer wiring having a wiring film formed by electroplating; and selectively etching the base.

According to the present invention, there is provided a wiring substrate comprising: a base made of a metal; a first insulating film having openings formed on the base; at least one layer wiring formed on the first insulating film, the layer wiring having a wiring film made of a metallized film at a lower portion; and a second insulating film formed on a region that the layer wiring is formed, except for a portion, wherein the base is selectively etched to partially expose a back surface of the wiring film.

In the wiring substrate of the present invention, the base is partially removed to form at least one selected from a group having a ground layer, a power source plane, a terminal, a dam and a reinforcement portion, and the opening formed in the first insulating film is filled with the wiring film to connect the wiring film to at least one selected form the group.

In the wiring substrate of the present invention, the metallized film is made of a wiring film material and a material having selective etching property.

In the wiring substrate of the present invention, the partially removed base forms a terminal for connecting with other member.

In the wiring substrate of the present invention, a terminal to formed on a portion of the region that the layer wiring is formed, by partially removing the second insulating film, and a hole for filling a buffer is formed at a position corresponding to the terminal of the base, the buffer is filled in the hole.

In the wiring substrate of the present invention, on the region that the layer wiring is formed, a portion where the second insulating film is partially removed serve as an opening for forming a bump electrode at which the layer wiring is partially exposed, and the bump electrode to be connected to the LSI chip by flip chip bonding are formed in the opening.

In the wiring substrate of the present invention, on the region that the layer wiring is formed, a portion where the second insulating film is partially removed serve as an opening for forming a bump electrode at which the layer wiring is partially exposed, and the bump electrode to be connected to other member are formed in the opening.

According to the present invention, there is provided a wiring substrate comprising: at least one layer wiring film formed on one side of the resin film having openings; and two kinds of metal bumps which are formed on the other side of the resin film, which are connected to the layer wiring film through the openings and which are different in height from each other.

In the wiring substrate of the present invention, lower metal bumps are bumps for flip chip bonding, and an LSI chip is bonded to the lower metal bumps.

In the wiring substrate of the present invention, an chip is disposed on the one side of the resin film where the layer wiring films are formed.

According to the present invention, there is provided a method for fabricating a wiring substrate comprising the steps of: selectively forming first solder films on one main surface of a base metal; forming a metal film on the one main surface of the base metal including the first solder films; forming an insulating film having openings on the metal film at positions corresponding to metal bumps to be formed later; forming at least one layer wiring on the insulating film; forming second solder films on the other main surface of the base m at positions where higher metal bumps are to be formed; and etching the base metal from the other main surface side using the second solder films as masks, and etching the metal film using as masks the first solder films and the second solder films, thereby forming higher metal bumps made from the metal film and the base metal and lower metal bumps made from the metal film.

In the fabricating method of the present invention, reflowing treatment is applied to the first and second solder films after forming the higher metal bumps and the lower metal bumps, so that the higher metal bumps and the lower metal bumps are covered with solders of the first and second solder films.

DETAILED DESCRIPTION OF THE PREFERRED EMBODIMENTS

Hereinafter, embodiments of the present invention will be described in detail with reference to the drawings.

Figure 1:
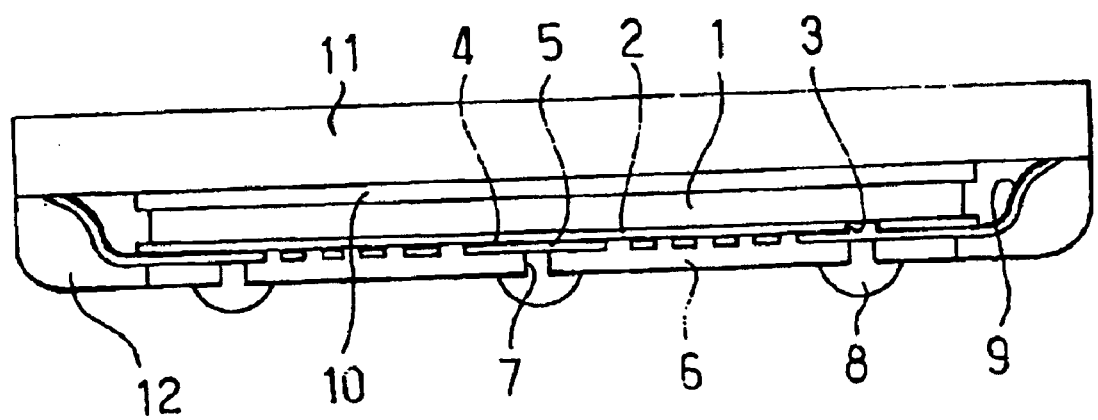
FIG. 1 is a sectional view showing a wiring substrate for mounting semiconductor elements according to Embodiment 1 of the present invention.

FIG. 1 is a sectional view showing a wiring substrate for mounting semiconductor elements according to Embodiment 1 of the present invention. FIGS. 2A to 2D and FIGS. 3A to 3C are sectional views showing in process order an example of a fabricating method of the wiring substrate and an example of a mounting method of an LSI (Large Scale integrated) chip in Embodiment 1 of the present invention, which is shown in FIG. 1.

As shown in FIG. 1, a base 1 is made of a metal such as copper, and forms into, for example, a ground wiring (or, a power source wiring). The thickness thereof is 50 to 250 μm, for example. A first insulating layer 2 is made from, for example, liquid photosensitive polyimide (or epoxy, etc.) and has openings 3 for connecting upper and lower wirings.

Wiring films 5 made of copper have as an under film a conductive layer 4 of Ni—P or Ni. Portions of the wiring films 5 fill the openings 3 for connecting upper and lower wirings to electrically connect the upper wiring to the lower wiring (the upper wirings are the wiring films 5 themselves and the lower wirings are the copper base 1).

A second insulating film 6 has openings 7 for forming ball electrodes. Ball electrodes (bump electrodes) 8 made of, for example, Ni or Ni—Au (or, Ni—solder) are formed by electroplating. At this stage, the wiring films 5 to form the ball electrodes are all electrically connected to the copper base 1 through the openings 3, so that applying electric potential necessary for electroplating is readily made. Accordingly, formation of the ball electrode by electroplating is possible.

Gold films 9 are formed on the surfaces of lead end portions of the wiring films 5 which are connected to electrodes of an LSI chip 11. This is for obtaining connectivity of the lead with the electrodes of the LSI chip 11. A buffer adhesive 10 is used to bond the LSI chip 11 to the back surface of the base 1, and to each electrode of the LSI chip 11 bonded by the buffer adhesive 10, corresponding lead end of the wiring films 5 is bonded. Incidentally, sealing is made with a sealing resin 12.

Next, a description will be given on a fabricating method of a wiring substrate and a mounting method of an LSI chip according to the present invention, with reference to FIGS. 2A to 3C.

(A) A board having a thickness of about 50 to 250 μm and made of, for example, copper is prepared as the base 1 of the wiring substrate, and one main surface (the front side surface) thereof is coated with the insulating film 2, which is photosensitive. Then, the photosensitive insulating resin layer 2 is exposed and developed to have the openings (opening for connecting upper and lower wirings) 3 and to b patterned into a pattern that does not cover a portion that will be bonded to the electrode of the LSI chip later. The openings 3 are formed in portions for connecting to each other circuits of a two-layer circuit, which will be formed later on both the surfaces. The wiring films to fill later the openings 3 serve as conducting means for connecting to each other the circuits of the two-layer circuit.

Figure 2A:
FIGS. 2A to 2D are sectional views showing in process order a fabricating method of the wiring substrate in FIG. 1.

Thereafter, for instance, a Pd activation treatment is performed. In the Pd activation treatment, for example, after adsorbing of palladium chloride colloid, reduction with acid is performed, as in a usual procedure, to cover the surface with Pd atoms. The conductive layer (metallized layer) 4 is further formed over the entire surface by electroless Ni—P plating (the film thickness is about 0.1 to 0.2 μm, for example) or the like. FIG. 2A shows the state after the conductive layer 4 is formed.

Figure 2B:
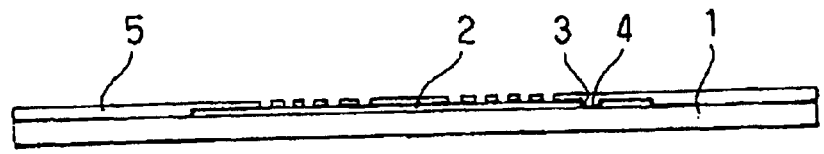

(B) The surface of the base 1 is plated with gold through electroplating (the thickness is 0.1 to 1 μm, for example) using a resist film as a mask, and is further plated with copper through electroplating, to thereby form the wiring film 5 (the thickness is 10 to 35 μm, for example). After removing the resist film used as a mask, the conductive layer 4, which has been formed over the entire surface prior to the removal of the resist film, is lightly etched (with an enchant such as FN-1001K that is developed by the present applicant and is suitable because it dissolves only electroless Ni or Ni—P without penetrating copper) and removed. This causes the wiring films 5 to avoid short circuit mutually. FIG. 2B shows the state after the removal.

Figure 2C:
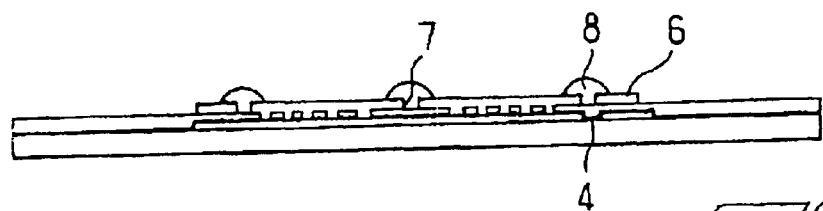

(C) The second insulating film 6 is then formed. The second insulating film 6 is made from, for example, polyimide or epoxy, has the openings 7 for forming ball electrodes, and has a pattern that does not cover portions of the wiring films 5 made of copper, the portions later becoming the lead ends connected to the electrodes of the LSI chip. Needless to say, the insulating film 6 is patterned using exposure and development techniques. Portions (on both the front surface side and the back surface side) excluding the openings 7 for forming ball electrodes are covered with a plating mask to form the ball electrodes 8 by electroplating in that state. The ball electrodes 8 are made of, for example, a Ni plating film alone, or of a Ni plating film and a gold plating film. FIG. 2C shows the state after the ball electrodes 8 are formed.

(D) While the front side of the base 1 to masked with, for example, a dry film, the back side thereof is selectively etched using as a mask a resist film to expose portions to be connected with the electrodes of the LSI chip. This etching may use, for example, an ammonium-based alkaline enchant that dissolves Cu but not Ni, or a mixed solution of hydrogen peroxide and sulfuric acid. The exposed Ni may be removed by a peeling solution.

Figure 2D:
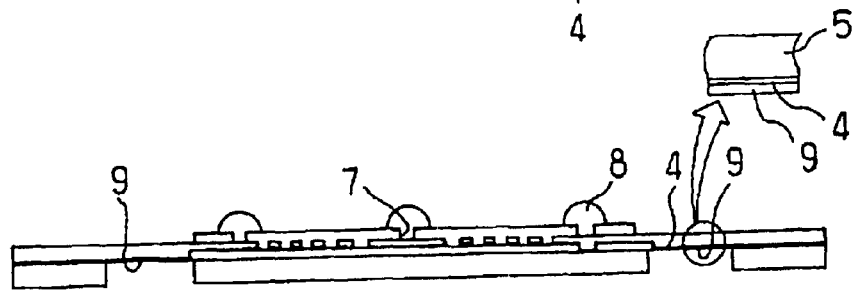

Thereafter, the mask such as the dry film and the mask such as the resist film, mentioned above, are removed. Thus the wiring substrate shown in FIG. 2D is fabricated.

Figure 3A:
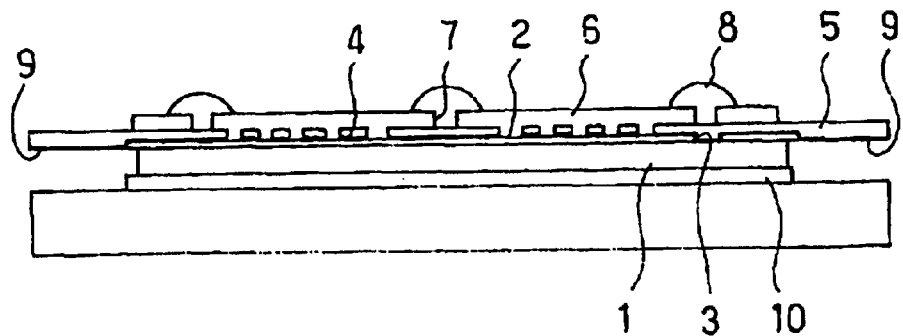
FIGS. 3A to 3C are sectional views showing in process order a mounting method of an LSI chip to the wiring substrate in FIG. 1.
Figure 3B:
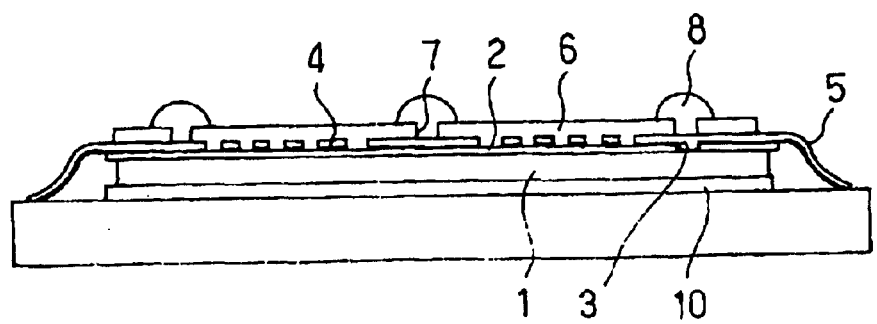

Subsequently, the LSI chip is mounted as shown in FIGS. 3A and 3B.

(E) As shown in FIG. 3A, the LSI chip 11 is bonded to the back surface of the base 1 through the buffer adhesive 10.

(F) As shown in FIG. 35, the lead end portions of the wiring films 5 are bonded by the single point bonding to the electrodes of the LSI chip 11.

Figure 3C:
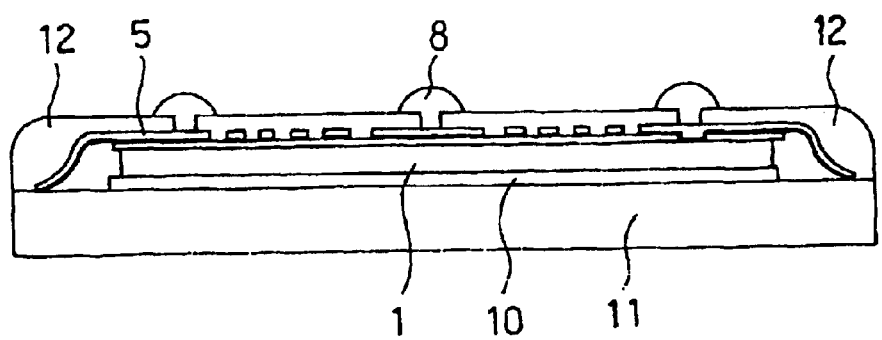

(G) After that, the sealing resin 12 is used for sealing as shown in FIG. 3C.

When the outer shape cutting is performed to remove unnecessary portions of the wiring substrate and the substrate is inverted, the wiring substrate shown in FIG. 1 is obtained.

According to the wiring substrate as such, highly rigid copper is used as the base 1, so that mechanical strength for the wiring substrate can be enhanced, resulting in less deformation at the packaging process. In spite of their thinness, the wiring films 5 can avoid shrinking from thermal shift caused by the difference in thermal expansion coefficient between the wiring films 5 and the insulating film 2, because of the presence of the copper base 1 formed on the back surface side of the wiring films 5 through the insulating film 2.

Ni—P by electroless plating or Ni by electroless plating which forms the conductive layer 4 may have a large etching selection ratio with respect to copper used for forming the base 1 and the wiring film 5. Therefore, the Ni—P or Ni functions effectively as an etching stopper when the conductive layer 4 between the wiring films 5 is removed and the base 1 is selectively etched. If a first plating layer of the wiring films 5 is made from gold, the layer of gold also serves to improve bondability of the wiring films 5 on the back surface.

When the conductive layer 4 is made from Ni—P by electroless plating or Ni by electroless plating, gold films 9 are required to be formed by gold plating after the selective etching of the base 1, as described above. However, it can be said that electroplating is preferred to electroless plating, for the former can provide stable film quality. In that case, the lead portions of each of the wiring films 5 is coupled, for the purpose of power supplying, with the base metal on the outer periphery prior to the plating, and the coupling is cut after the electroplating to form the conductive layer 4. In the case of the electroplating, the gold films 9 are formed only in exposed portions of (the conductive layer 4 of) the wiring films 5 by the etching of the base 1. Accordingly, waste of gold can be eliminated, reducing usage of gold.

Further, the ball electrodes 8 may be formed by electroplating. The electrodes' nickel has strong adherence to the wiring films 5 and the balls of nickel grow through the insulating film 6 expansively, so that the contact area with a solder plating layer may be as large as the area of the post-attachment ball electrode, leading to an advantage in that the defeat of ball falling off does not takes place. Namely, applying electric potential in electroplating is difficult for a conventional type wiring circuit to form its base from a polyimide film because the base is an insulating material. In this embodiment, however, the portions to form the ball electrodes 8 are electrically connected to the base 1 at the time of formation of the electrodes, making it easy to apply electric potential. The ball electrodes thus may be formed by the electroplating. As mentioned above, the ball electrodes 8 by electroplating are superior in adherence as compared with the post-attachment solder ball electrodes, can provide contact area as large as the area for the post-attachment ball, and cause less defeat of ball falling off.

Figure 41:
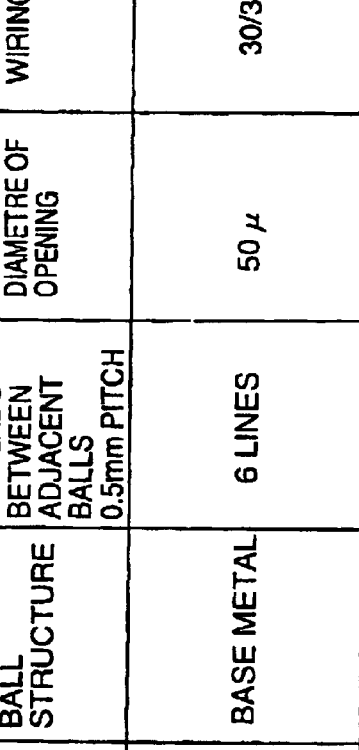
FIG. 41 is a diagram showing in comparison the number of wirings that can be formed between ball electrodes which corresponds to the respective terminal structure.

Concretely, as shown in FIG. 41, when the post-attachment ball electrodes are formed on the premise that the L/S (Line width/Space) of the wiring is 30/30 μm, and the ball electrode pitch is 0.5 mm, it is necessary to set the diameter of each opening for forming electrode to 300 μm. In the case where electroplating is used for the formation, the diameter may be reduced down to about 100 μm, and the number of the wirings threading through adjacent ball electrodes may be increased up to 5, while the number is 1, 2 or so in the case of the post-attachment. This increase in wiring number is exactly equivalent to the remarkable enhancement in densification of the wiring substrate.

Figure 4:
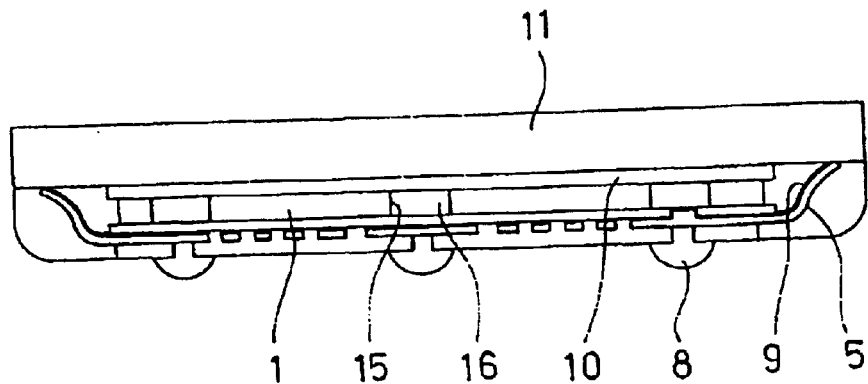
FIG. 4 is a sectional view showing a wiring substrate according to Embodiment 2 of the present invention.

FIG. 4 is a sectional view showing a wiring substrate according to Embodiment 2 of the present invention. In this embodiment, holes 15 to be filled with a buffer are formed in portions of a base 1 which correspond to ball electrodes 8, and a buffer 16 is filled in the holes 15. The buffer 16 is to release thermal stress concentrating on the ball electrodes 8 by difference in coefficient of linear thermal expansion among the wiring substrate, a printed wiring board to which the wiring substrate to attached and an LSI chip 11 after mounting. The buffer 16 can also prevent occurrence of cracks in the LSI chip 11 by absorbing collision load applied upon connecting to the printed wiring board.

This wiring substrate may be fabricated by forming the holes 15 to be filled with a buffer in etching the base in the above fabrication method, and filling the holes 15 with the buffer 16 prior to the bonding of the LSI chip 11.

Figure 5:
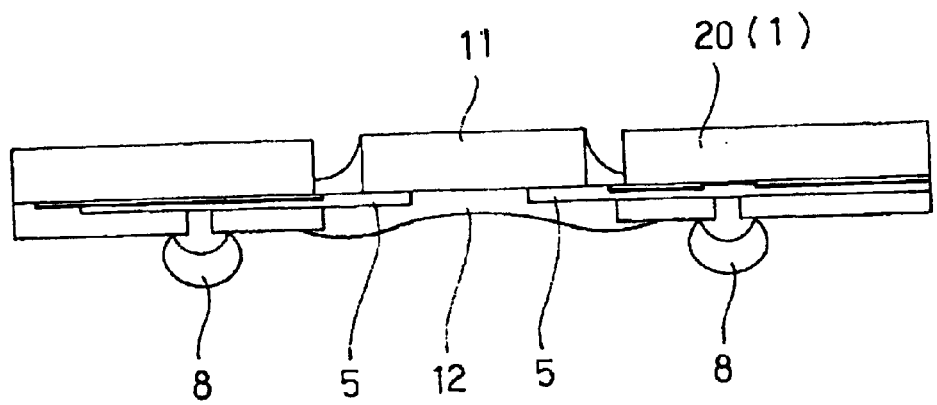
FIG. 5 to a sectional view showing a wiring substrate according to Embodiment 3 of the present invention.

FIG. 5 is a sectional view showing a wiring substrate according to Embodiment 3 of the present invention. This embodiment is the case where the present invention is applied to a BGA(ball grid array) type and is different in that point from Embodiment 1 of the present invention in which the invention is applied to a CSP (chip size package) type. However, this embodiment has much in common with Embodiment 1 to relish the effect thereof and, in addition, has another effect in that a base 1 can constitute stiffeners 20. Originally, a stiffener is attached in post-attachment to the wiring substrate with the need of the bonding process, and usually has a problem of troublesome positioning in the bonding. However, according to this embodiment, the stiffeners 20 are formed by utilizing the base 1 during the fabrication process of the wiring substrate, and the positioning can reach high accuracy obtained by the photolithography technique fully used in fabrication of the wiring substrate. Therefore, the conventional problem regarding to the stiffener is completely solved. Incidentally, a portion of the base 1 which is between the stiffeners 20, as it is, serves as a device hole of the wiring substrate.

Figure 6A:
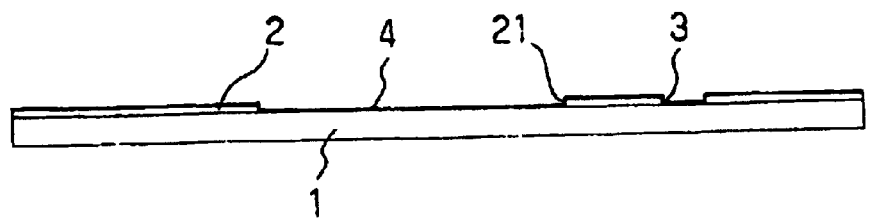
FIGS. 6A to 6D are sectional views showing in process order a fabricating method of the wiring substrate in FIG. 5.
Figure 6B:
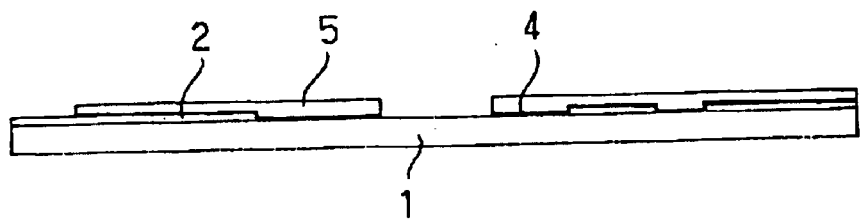
Figure 6C:
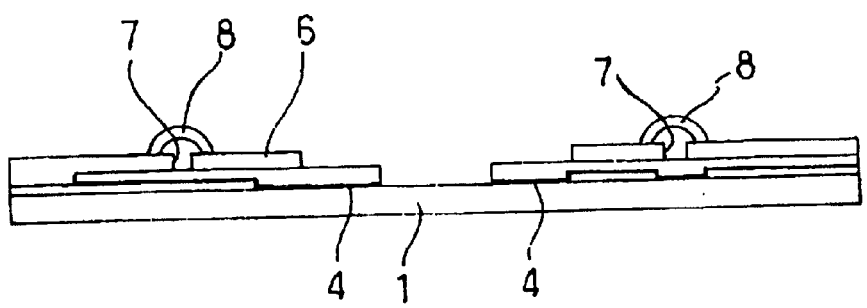
Figure 6D:
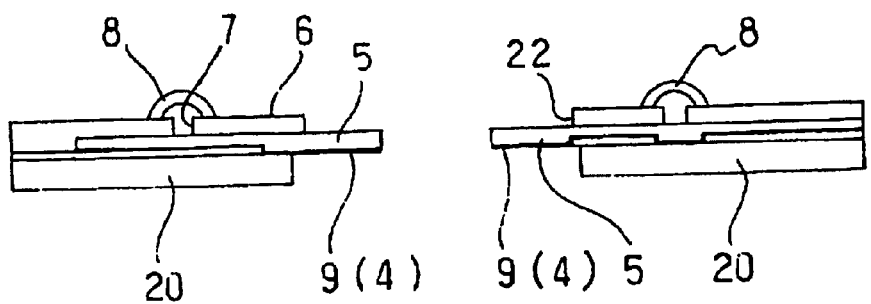
Figure 7A:
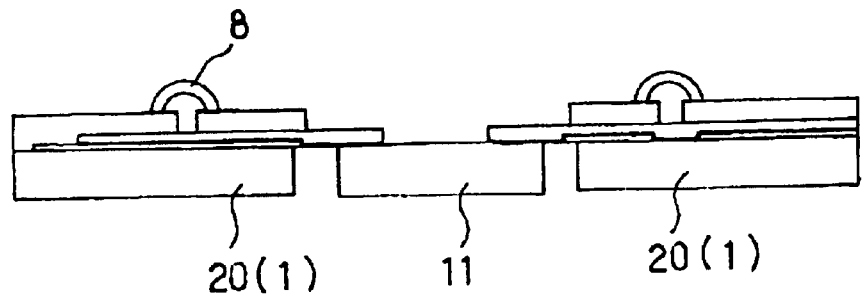
FIGS. 7A and 7B are sectional views showing in process order a mounting method of the LSI chip to the wiring substrate in FIG. 5.
Figure 7B:
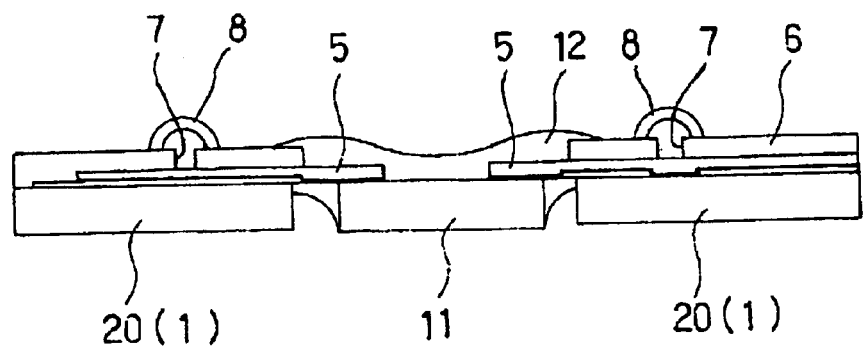

FIGS. 6A to 6D show in process order a fabricating method of the wiring substrate shown in FIG. 5, and FIGS. 7A and 7B are sectional views showing in process order a mounting method of an LSI chip.

(A) A board made of copper is prepared as the base 1 of the wiring substrate, and one main surface (front side surface) of the board is coated with an insulating film 2 having photosensitivity. The film 2 is patterned by exposure and development. Thus formed is an opening 3 for connecting upper and lower wirings and an opening 21 disposed substantially at the center, roughly corresponding to a portion to be the device hole.

Thereafter, for instance, a Pd activation treatment is performed to form over the entire surface a conductive layer 4 (metallized layer) by electroless Ni—P plating or the like. FIG. 6A shows the state after the conductive layer 4 is formed.

(B) wiring films 5 are formed on the surface of the base 1. After removing a resist film used upon formation of the films 5 as a mask for patterning, the conductive layer 4, which has been formed over the entire surface prior to the removal of the resist film, is lightly etched and removed. This causes the wiring film 5 to avoid short circuit mutually. FIG. 2B shows the state after the removal.

(C) A second insulating film 6 is then formed. The second insulating film 6 has openings 7 for forming ball electrodes, and a pattern with an opening 22 that is to be the device hole. Portions (on both the front surface side and the back surface side) excluding the openings 7 for forming ball electrodes are covered with a plating mask to form ball electrodes 8 by electroplating in that state. The ball electrodes 8 are made from, for example, somicrystalline solder/Ni plating. FIG. 6C shows the state after the ball electrodes 8 are formed.

(D) While the front side of the base 1 is masked with, for example, a dry film, the back side thereof to selectively etched using as a mask a resist film to expose a substantially central portion to be connected to the electrodes of an LSI chip. Through this, a device hole 23 to formed. By forming the device hole 23, the base 1 serves as the stiffeners 20. Gold films 9 are then formed by plating.

Thereafter, the mask such as the dry film and the mask of the resist film, mentioned above, are removed. Thus completes fabrication of the wiring substrate shown in FIG. 6D.

Subsequently, the LSI chip is mounted as shown in FIGS. 7A and 7B.

(E) As shown in FIG. 7A, each electrode of an LSI chip 11 is bonded to corresponding lead front end of the wiring films 5 within the device hole 23.

(F) After that, a sealing resin 12 is used for sealing as shown in FIG. 7C.

When the outer shape cutting is performed to remove unnecessary portions of the wiring substrate and the substrate is inverted, the wiring substrate shown in FIG. 5 is obtained. Incidentally, if the ball electrodes 8 are made from solder, shaping is made by reflowing. The ball electrodes 8 may be made from, for example, Au/Ni instead of solder. In this case, shaping by reflowing is not carried out.

Figure 8:
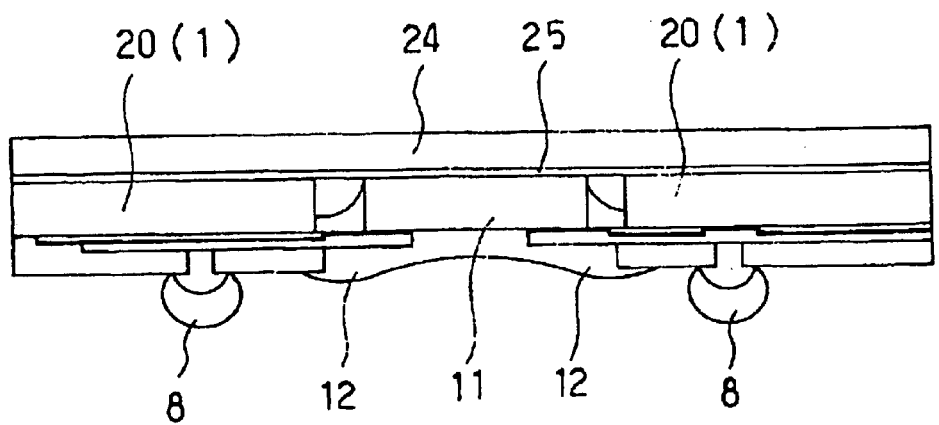
FIG. 8 is a sectional view showing a wiring substrate according to Embodiment 4 of the present invention.

FIG. 8 is a sectional view showing a wiring substrate according to Embodiment 4 of the present invention. In this embodiment, a heat spreader (heat sink) 24 is bonded with an adhesive 25 to the wiring substrate shown in FIG. 5. This may enhance heat radiation ability of the LSI chip 11. The heat spreader 24 is bonded through the adhesive 25 to the back surfaces of the stiffeners 20 and the LSI chip 11. The wiring substrate as such may be readily obtained by putting the bonding process after the process shown in FIG. 7B. Incidentally, to avoid level difference between the back surface of the LSI chip 11 and the back surfaces of the stiffeners 20, the LSI chip 11 is subjected to back grind, or the thickness of the base 1 made of copper is adjusted.

Figure 9:
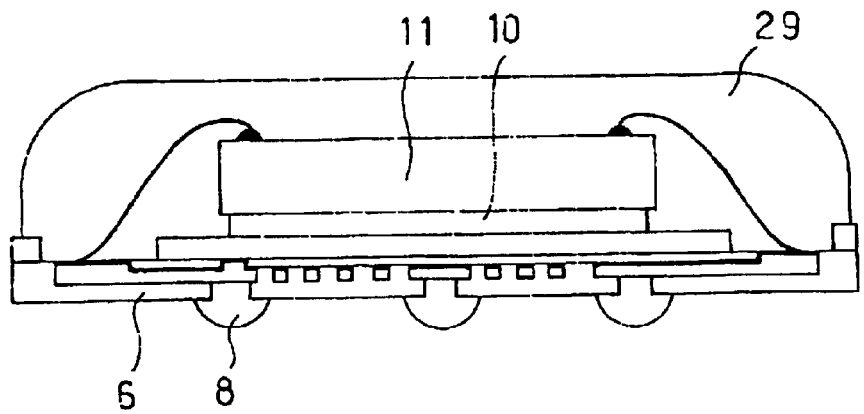
FIG. 9 is a sectional view showing a wiring substrate according to Embodiment 5 of the present invention.

FIG. 9 is a sectional view showing a wiring substrate according to Embodiment 5 of the present invention. In this embodiment, the present invention is applied to a wiring substrate of the type to use wire bonding for electrically connecting the wiring substrate to an LSI chip. This embodiment to different in type from Embodiment 1 and differs in construction. However, two embodiments have much in common, and the construction of this embodiment will naturally unfold with the progress of the explanation about a fabricating method and a mounting method of an LSI chip. Therefore, the fabricating method of the wiring substrate and the mounting method of the LSI chip will be described in accordance with FIGS. 10A to 10C and FIGS. 11A and 11B, and then additional description will be made restricting to points where constructional difference resides.

Figure 10A:
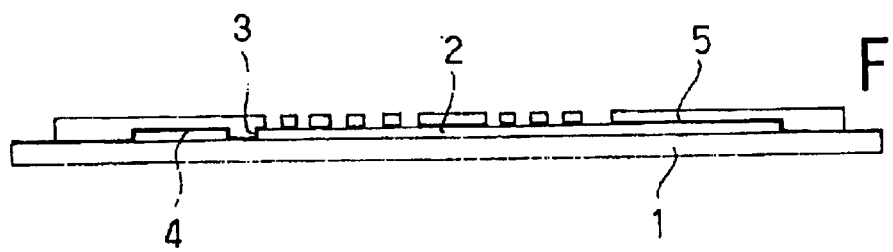
FIGS. 10A to 10C are sectional views showing in process order a fabricating method of the wiring substrate in FIG. 9.
Figure 10B:
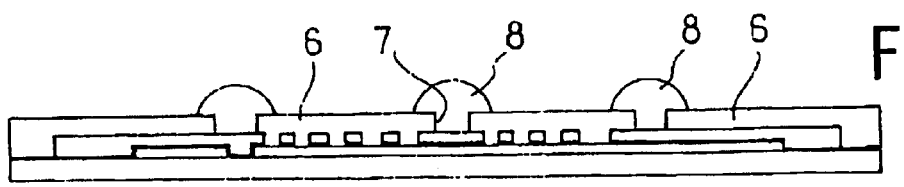
Figure 10C:
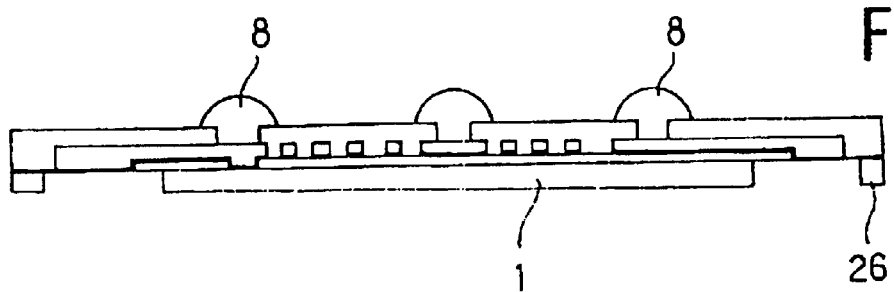

FIGS. 10A to 10C are views showing in process order the fabricating method of the wiring substrate shown in FIG. 9.

(A) A board made of copper is prepared as a base 1 of the wiring substrate, and one main surface (front side surface) of the board is coated with the insulating film 2 having photosensitivity. The film 2 is patterned by exposure and development. Denoted by reference symbol 3 is an opening for connecting upper and lower wirings.

Thereafter, for instance, a Pd activation treatment is performed to form over the entire surface a conductive layer 4 (metallized layer) by electroless Ni—P plating or the like. FIG. 10A shows the state after the conductive layer 4 is formed.

(B) Wiring films 5 are next formed on the surface of the base 1. The formation of the wiring films 5 is as follows. After forming a resist film for patterning, a thin gold plating (with a thickness of 1 µm, for example) is first formed by electroplating, Ni plating (with a thickness of 5 µm, for example) is further formed by electroplating, and copper plating (with a thickness of 30 µm, for example) is formed by electroplating.

Thereafter, the resist film used upon formation of the wiring films 5 as a mask for patterning is removed, and the conductive layer 4, which has been formed over the entire surface prior to the removal of the resist film, is lightly etched and removed. This causes the wiring films 5 to avoid short circuit mutually. Further, after forming a second insulating film 6 with a pattern that has openings 7 for forming ball electrodes, ball electrodes 8 made of, for example, Ni or Ni—Au are formed. FIG. 10B shows the state after formation of the ball electrodes 8. The second insulating film 6 mechanically supports portions of the wiring films 5 which are to be the leads and, further, to widely formed to extend to the outermost peripheral portions so that it can hold dams 26 formed from the base 1, which will be described later. This is one of the points that are different from Embodiment 1.

(C) While the front side of the base 1 is masked with, for example, a dry film, the back side thereof is selectively etched, using as a mask a resist film, to expose peripheral center portions to be connected to electrodes of the LSI chip through wires. At that time, in this embodiment, the outermost peripheral portions of the base 1 are left as the dams 26. This is for preventing a liquid sealing r sin from flowing to the outside when the resin is used for sealing. FIG. 10C shows the state after the selective etching.

Figure 11A:
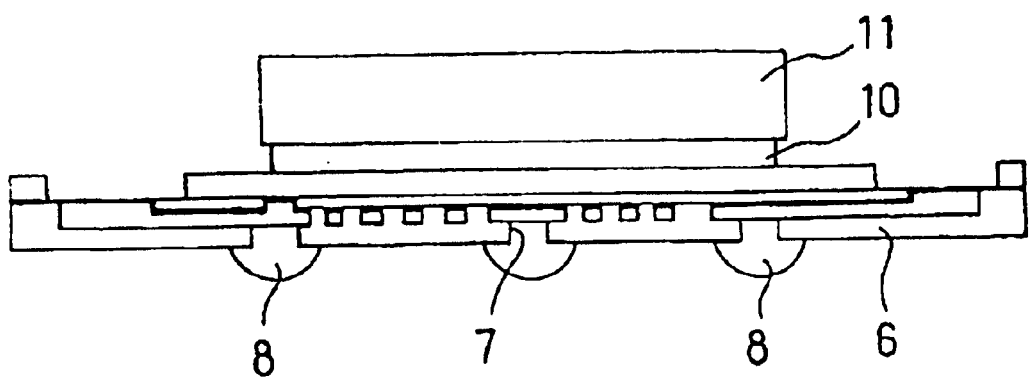
FIGS. 11A and 11B are sectional views showing in process order a mounting method of the LSI chip to the wiring substrate in FIG. 9.
Figure 11B:
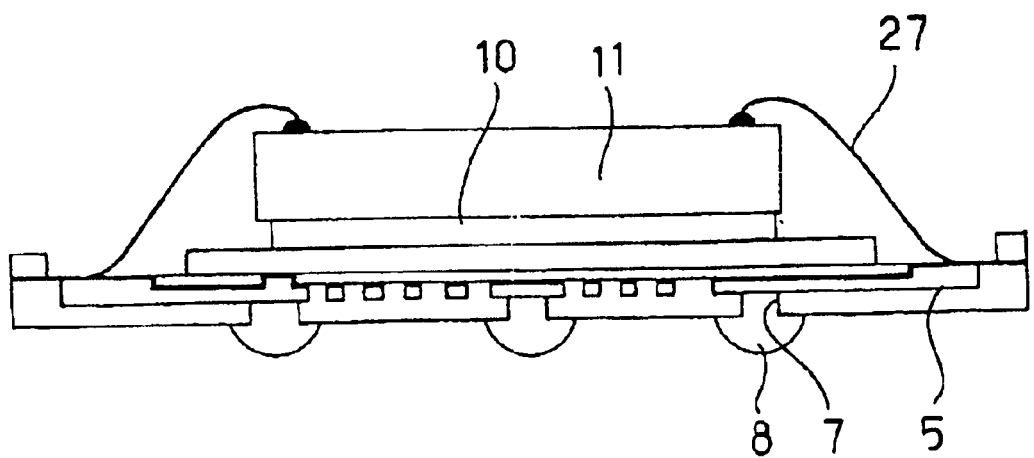

FIGS. 11A and 11B are views showing in process order the mounting method of an LSI chip.

(D) As shown in FIG. 11A, an LSI chip 11 is bonded through an adhesive 10 to the back surface of the base 1.

(E) Bonding is accomplished between each electrode of the LSI chip 11 and the corresponding lead front end of the wiring film 5, using wires 27 made of, for example, gold. FIG. 11B shows the state after the wire bonding.

(F) After that, the LSI chip 11 and the wire bonding portion are sealed with a liquid resin 29, and outer shape cutting is carried out. This completes the fabrication of the wiring substrate shown in FIG. 9.

In this wiring substrate, a ground line and the dams 26 are formed from the base 1, the back surface of which is bonded to the LSI chip 11, and the wiring films 5 made of copper are formed on the front side of the base 1 through the insulating film 2 having the opening 3 for connecting upper and lower wirings. On the wiring films 5, the insulating film 6 having the openings 7 for forming ball electrodes is formed to cover the entire region of the front side of the base 1. The ball electrodes 8 are formed in the openings 7 for forming ball electrodes. The electrodes of the LSI chip 11 are bonded by the wires 27 to the back surfaces of the lead front ends of the wiring films 5. The LSI chip 11 and the wire bonding portions are sealed with the liquid resin 29, and the resin flow toward the outside is dammed back by the dams 26.

Figure 12:
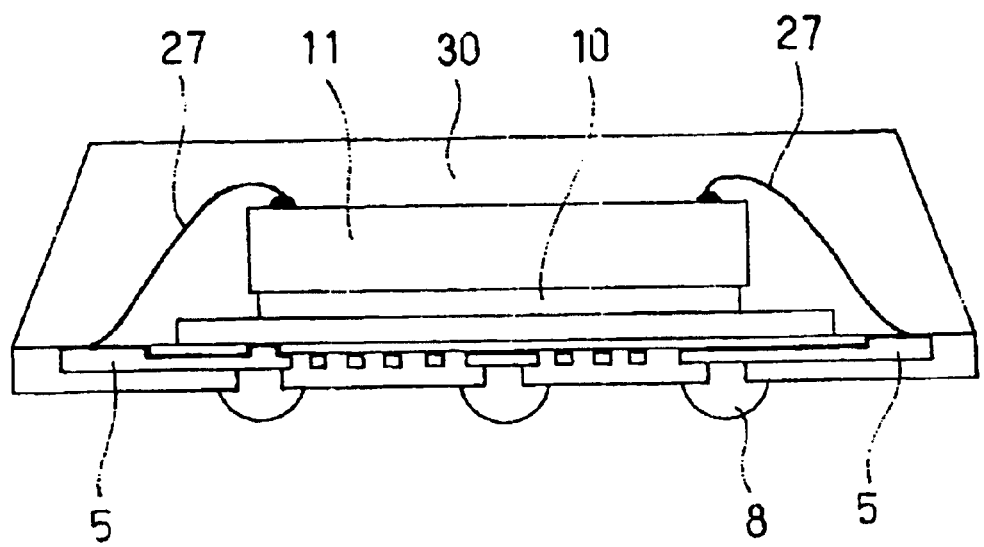
FIG. 12 is a sectional view showing a wiring substrate according to Embodiment 6 of the present invention.

FIG. 12 is a sectional view showing a wiring substrate according to Embodiment 6 of the present invention. In this embodiment, the resin sealing in Embodiment 5 shown in FIG. 9 is made by transfer molding, instead of the potting of the liquid resin. Other than that, there is no difference between this embodiment and Embodiment 5. Reference symbol 30 denotes a sealing resin for transfer molding. Incidentally, the dams 26 are unnecessary in this case, and eliminated.

Figure 13:
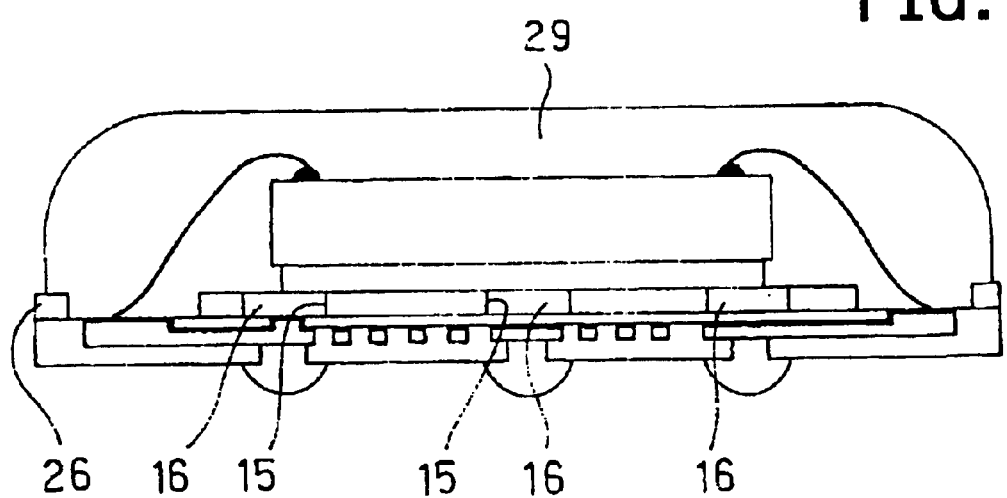
FIG. 13 is a sectional view showing a wiring substrate according to Embodiment 7 of the present invention.

FIG. 13 is a sectional view showing a wiring substrate according to Embodiment 7 of the present invention. This embodiment is a modification of Embodiment 5 in which holes 16 to be filled with buffer is formed in the base 1, and a filler 17 is filled in the holes 16 to be filled with buffer. The purpose thereof, that the holes 16 to be filled with buffer are formed at positions corresponding to the ball electrodes 8, the formation method of the holes to be filled with buffer, and the filling method of the filler 17 are the same as those in Embodiment 2 shown in FIG. 4.

Figure 14:
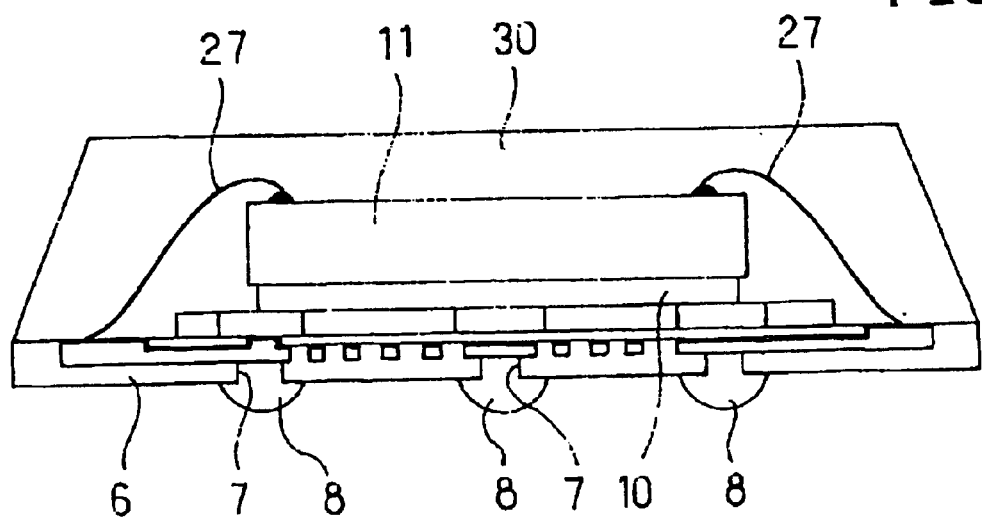
FIG. 14 is a sectional view showing a wiring substrate according to Embodiment 8 of the present invention.

FIG. 14 is a sectional view showing a wiring substrate according to Embodiment 8 of the present invention. This embodiment is a modification of Embodiment 6 in which the holes 16 to be filled with buffer are formed in the base 1, and the filler 17 is filled in the holes 16 to be filled with buffer. The purpose thereof, that the holes 16 to be filled with buffer are formed at positions corresponding to the ball electrodes 8, the formation method of the holes to be filled with buffer, and the filling method of the filler 17 are the same as those in Embodiment 2 shown in FIG. 4.

Figure 15:
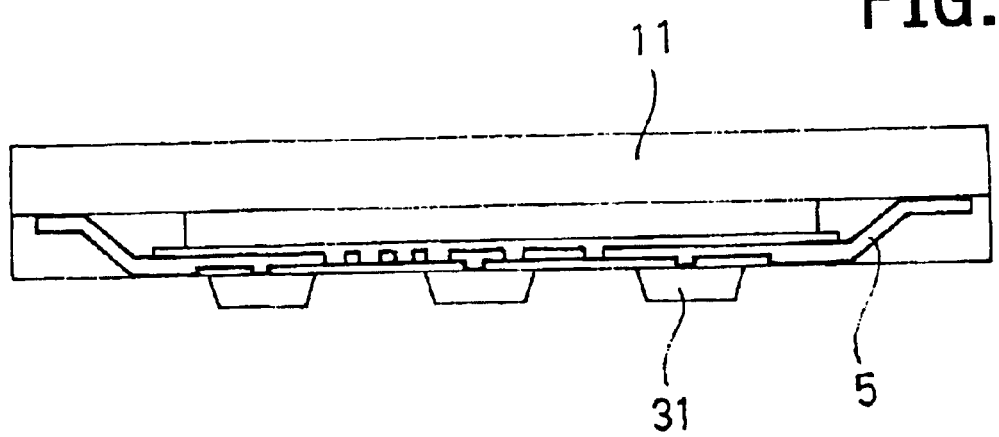
FIG. 15 is a sectional view showing a wiring substrate according to Embodiment 9 of the present invention.

FIG. 15 is a sectional view showing a wiring substrate according to Embodiment 9 of the present invention. This embodiment utilizes a base 1 that is made of a metal, for example, copper also as a terminal, and has a great advantage in that formation of any ball electrodes 8 is not necessary. The construction of this embodiment will also unfold naturally with the progress of the explanation about a fabricating method and a mounting method of an LSI chip. Therefore, the methods will be described in accordance with FIGS. 16A to 16D and FIGS. 17A to 17C, respectively.

Figure 16A:
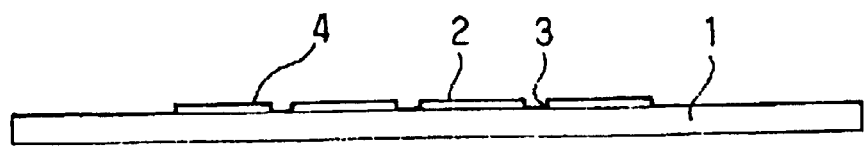
FIGS. 16A to 16D are sectional views showing in process order a fabricating method of the wiring substrate in FIG. 15.

(A) A thin board made of copper, or the like, is prepared as the base 1 and coated with a first insulating film 2 made of, for example, a photosensitive resin. The insulating film 2 is patterned by exposure and development to have openings 3 for connecting upper and lower wirings. The patterning also shapes the film 2 so that it does not cover outer portions corresponding to leads of wiring films 5 that will be formed later. Thereafter, a conductive layer 4 is formed by the above-described processing for obtaining conduction. FIG. 16A shows the state after the processing for obtaining conduction.

Figure 16B:
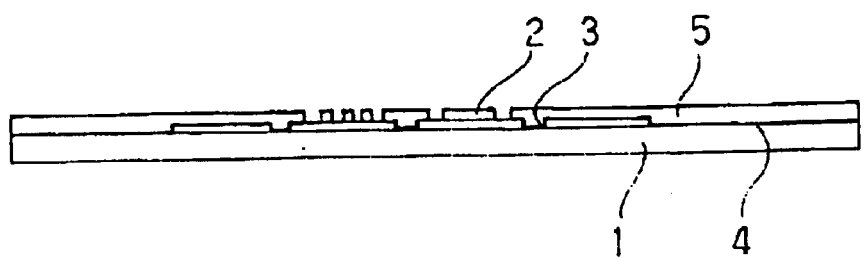

(B) The wiring films 5 made of copper are next formed by the above-mentioned electroplating using as a mask a resist film. Then, the resist film is removed and the conductive layer 4 is removed by light etching to make each of the wiring films 5 independent. FIG. 16B shows the state after formation of the wiring films 5.

Figure 16C:
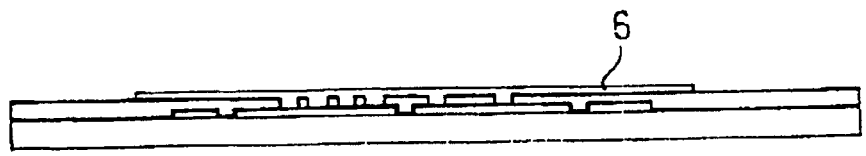

(C) As shown in FIG. 16C, the regions for forming the wiring films 5, except for portions to be the leads, are covered with an insulating film 6.

Figure 16D:
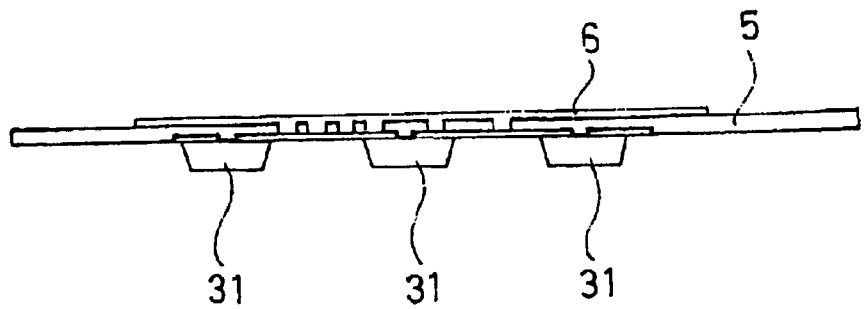

(D) As shown in FIG. 16D, the base 1 is selectively etched from the back surface side. Here, the important things in this embodiment are to selectively etch the base 1 so as to form terminals 31 that replace the ball electrodes, and to prevent erosion of the wiring films 5 by means of, for example, the insulating film 2 made of, for example, a photosensitive resin which functions as an etching stopper. The terminals 31 are electrically connected to the wiring films 5, respectively, through portions of the wiring films 5 which fill the openings 3 for connecting upper and lower wirings. After this etching processing, the exposed surfaces of the wiring films 5 are subjected to surface treatment to obtain connectivity.

Subsequently, a description will be given on the mounting method of an LSI chip 11 with reference to FIGS. 17A to 17C.

Figure 17A:
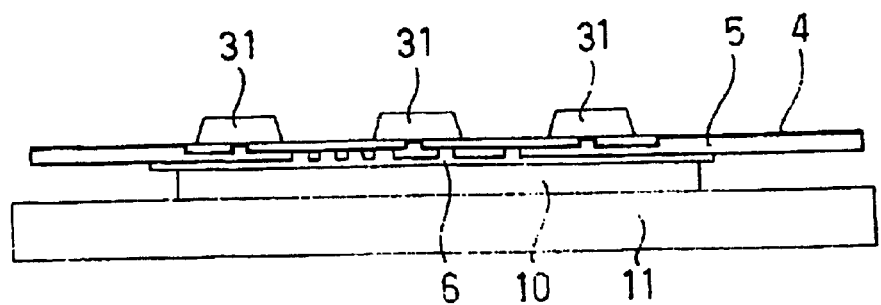
FIGS. 17A to 17C are sectional views showing in process order a mounting method of the LSI chip to the wiring substrate in FIG. 15.

(E) As shown in FIG. 17A, the LSI chip 11 is bonded through an adhesive 10 to the back surfaces of the terminals 31.

Figure 17B:
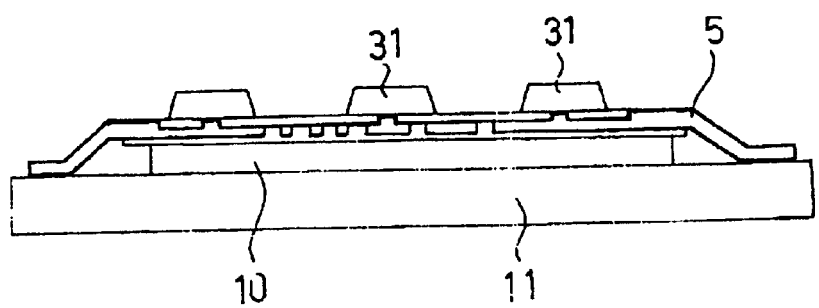

(F) As shown in FIG. 17B, the lead front ends of the wiring films 5 are bonded by single point bonding to electrodes of the LSI chip 11.

Figure 17C:
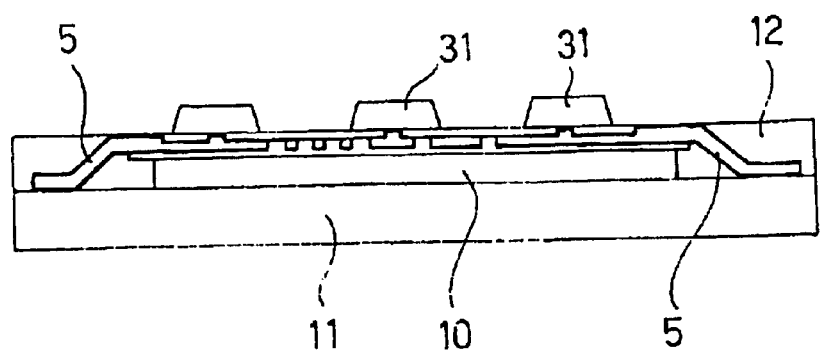

(G) As shown in FIG. 17C, sealing is made by a resin 12. This completes the fabrication of the wiring substrate shown in FIG. 15.

In this wiring substrate, on one side of the insulating film 2 having the openings 3 for connecting upper and lower wirings, the terminals 31 (terminals replacing the ball electrodes) made from the base are formed, and the wiring films 5 connected to the terminals 31 through the openings 3 for connecting upper and lower wirings are formed on the other side. The insulating film 6 is formed on the region for forming the wiring films 5. The insulating film 6 is bonded through the adhesive 10 to the back surface of the LSI chip 11, and the LSI chip 11 is bonded by single point bonding to the lead front ends of the wiring films 5 of the wiring substrate. The substrate is sealed with the resin.

According to this wiring substrate, the base 1 forms into the terminals 31 that replace the ball electrodes, eliminating the need for various troublesome processes required to form the ball electrodes and providing a great advantage in that the terminals are utterly free from fear of defect such as a defect of ball falling off. The ball electrodes 8 formed by electroplating mentioned above have an advantage in that, as compared to the case of the post-attachment solder ball, area to be allotted for formation of the electrodes 8 may be reduced. However, the effect obtained by the terminals 31 made from the base 1 is even greater than the effect brought by the ball electrodes 8.

Specifically speaking, as shown in FIG. 41, the required diameter of the opening that has to b formed in the insulating film to form the terminal (ball electrode) is 300 $\mu$m, in the case of the post-attachment solder ball, 100 $\mu$m, if the ball electrodes by electroplating, and 50 $\mu$m is sufficient for the diameter in the case of the terminals 31. Accordingly, when the arrangement pitch of the terminal (electrode) is set to 0.5 mm, the number of wirings that can be formed between adjacent terminals (electrodes) is 1 to 2, in the case of the post-attachment solder ball, 5, if the ball electrode by electroplating, and, in contrast to these, 6 for the case of the terminals 31. The above values are presented on the premise that L/S of the wiring is 30/30 $\mu$m. The terminals 31 formed by selectively etching the base 1 have height that is determined by the thickness of the base 1, and have an advantage of extreme readiness in connecting them to other member, for example, printed wiring substrate, owing to their very high uniformity. This advantage is true to all Embodiments in which the terminals 31 are formed from the base 1.

Figure 18:
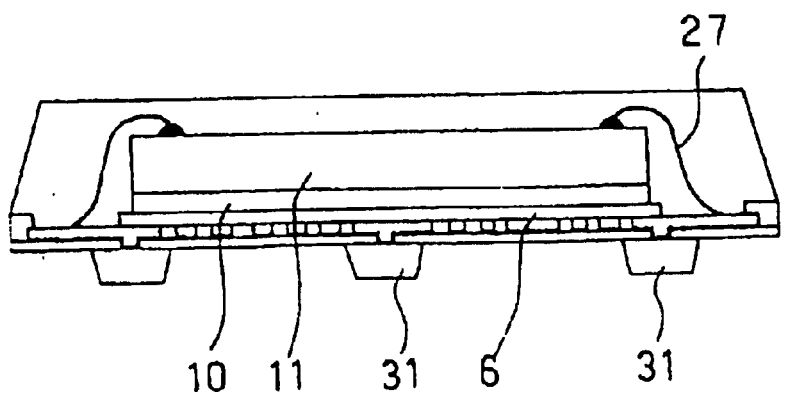
FIG. 18 is a sectional view showing a wiring substrate according to Embodiment 10 of the present invention.

FIG. 18 is a sectional view showing a wiring substrate according to Embodiment 10 of the present invention. This embodiment differs from Embodiment 9 shown in FIG. 15 merely in that, in this embodiment, leads of wiring films 5 and electrodes of an LSI chip 11 are connected by wire bonding and sealing is made by transfer molding, accordingly providing a slight difference in construction. Also, two embodiments do not fundamentally vary in the fabricating method. Therefore, that small difference will be explained by description but the fabricating method of the wiring substrate and the mounting method of the LSI chip are not illustrated.

The wiring films 5 have on their surfaces gold film formed by, for example, successive plating consisting of copper electroplating (the thickness is 25 $\mu$m, for example), Ni plating (the thickness is 5 $\mu$m, for example), and gold electroplating (the thickness is 0.3 to 2 $\mu$m, for example).

This is for enhancing wire bondability. The gold films may be formed such that, once the wiring films 5 are formed by copper electroplating, the insulating film 6 having openings in portions where the wire bonding is to be formed is formed, and gold plating then takes place. With this, the gold films are formed only at the opening, avoiding waste of gold.

Figure 19:
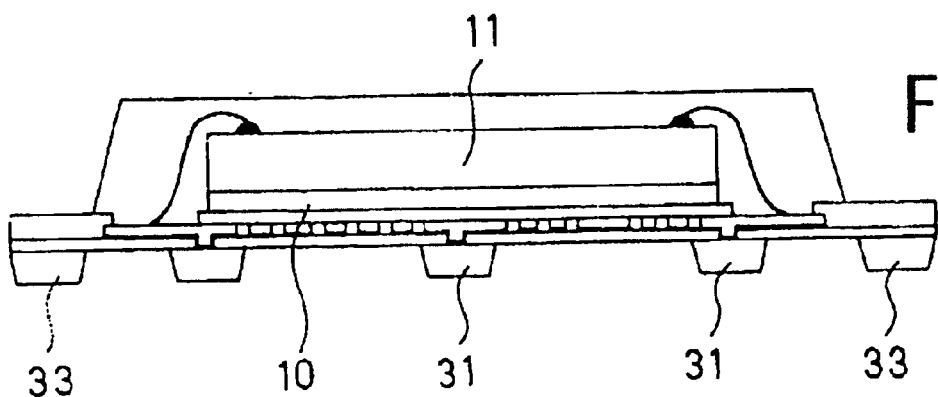
FIG. 19 is a sectional view showing the state of the wiring substrate in FIG. 18 prior to outer shape cutting.

That the insulating film 6 to formed to have the openings in the portions where the wire bonding is to be formed is not something to be featured, but, aside from it, the film 6 in this embodiment differs from the one in Embodiment 9 in the following point. The film 6 in this embodiment is formed to reach the outer peripheral portions so that lead front ends of the wiring films 5 can be held. Another difference is that resin sealing to made by transfer molding. In this embodiment, the base 1 and the LSI chip 11 are on the sides opposite to each other, which facilitates sealing with a mold. This embodiment is thus suitable for transfer molding. The wiring substrate according to this embodiment is provided, at the outer peripheral portions, with a reinforcement portion that functions as a reinforcement member until it is out off in the outer shape cutting processing when terminals 31 are formed by selective etching of the base 1. This is for facilitating wire bonding. FIG. 19 shows the state before that outer shape cutting, and reference symbol 33 in the drawing denotes the reinforcement portion formed from the base 1.

Figure 20:
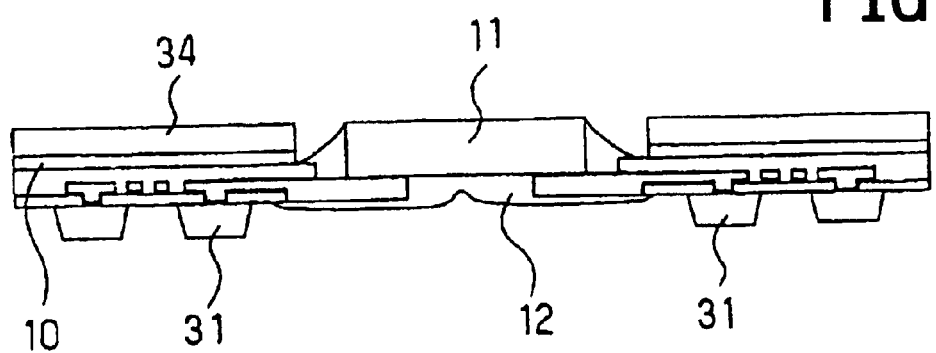
FIG. 20 is a sectional view showing a wiring substrate according to Embodiment 11 of the present invention.

FIG. 20 is a sectional view showing a wiring substrate according to Embodiment 11 of the present invention. In this embodiment, the technical concept for forming terminals 31 from a base 1 is applied to a wiring substrate of BGA type. The construction of this wiring substrate will also unfold naturally with the progress of the explanation about the fabricating method thereof and the mounting method of an LSI chip, and will be described in accordance with FIGS. 21A to 21C and FIGS. 22A and 22B.

Figure 21A:
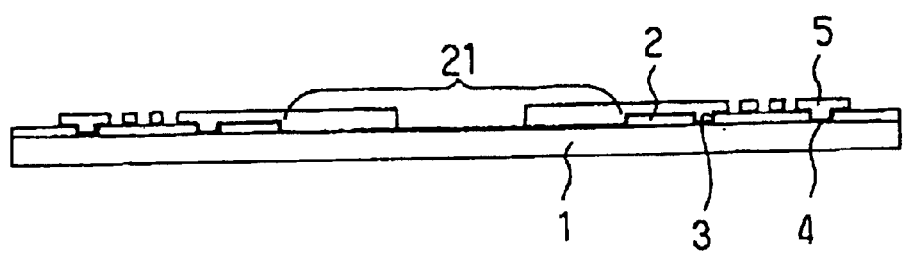
FIGS. 21A to 21C are sectional views showing in process order a fabricating method of the wiring substrate in FIG. 20.

(A) A board made of copper is prepared as the base 1, and is coated with a first insulating film 2 made of, for example, a photosensitive resin. The film 2 is patterned and shaped by exposure and development to have openings 3 for connecting upper and lower wirings and an opening 21 formed so as to generally correspond to a device hole. Further, a conductive film 4 is formed by the above-described processing for obtaining conduction. Wiring films 5 made of copper will then be formed. Gold films 9 (each having a film thickness of 0.1 to 2 μm, for example) are formed on the outermost surfaces of the films 5 to enhance bondability with an LSI chip 11. The wiring films 5, including both the Ni film 4 that forms the lower portions of the films 5 and the gold films 9, are formed by the above described electroplating with the use of a resist film as a mask. After that, the resist film is removed and the conductive film 4 is lightly etched and removed, making each of the wiring films 5 independent. FIG. 21A shows the state after the wiring films 5 are formed.

Figure 21B:
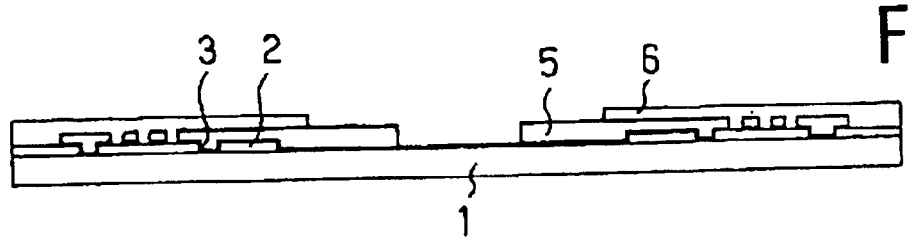

(B) As shown in FIG. 21B, the regions for forming the wiring films 5 are covered with insulating films 6, except for the leads and the portion to be the device hole.

Figure 21C:
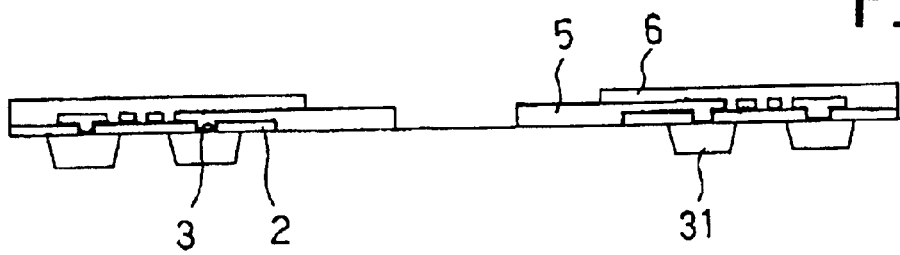

(C) As shown in FIG. 21C, the base 1 is selectively etched from the back surface side to form the terminals 31 that replace the ball electrodes. In this etching, the conductive film 4 functions as an etching stopper to prevent erosion of the wiring films 5. The respective terminals 31 are electrically connected to the wiring films 5 through portions of the wiring films 5 which fill the openings 3 for connecting upper and lower wirings. After this etching processing, terminal surface treatment is applied.

Subsequently, a description will be given on the mounting method of the LSI chip 11 with reference to FIGS. 22A and 22B.

Figure 22A:
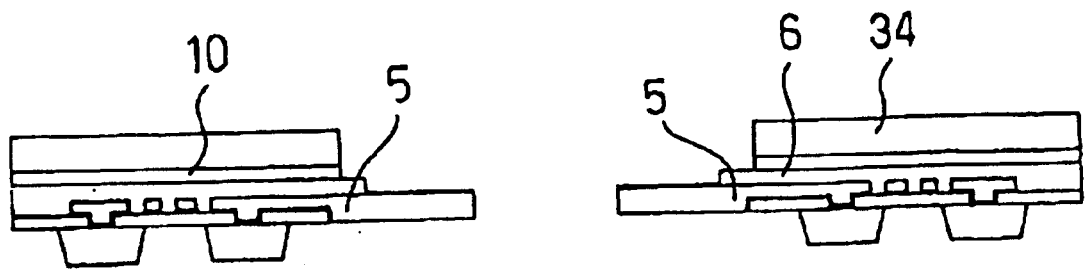
FIGS. 22A and 22B are sectional views showing in process order a mounting method of the LSI chip to the wiring substrate in FIG. 20.

(D) As shown in FIG. 22A, stiffeners 34 are bonded through an adhesive 10 to the insulating films 6.

Figure 22B:
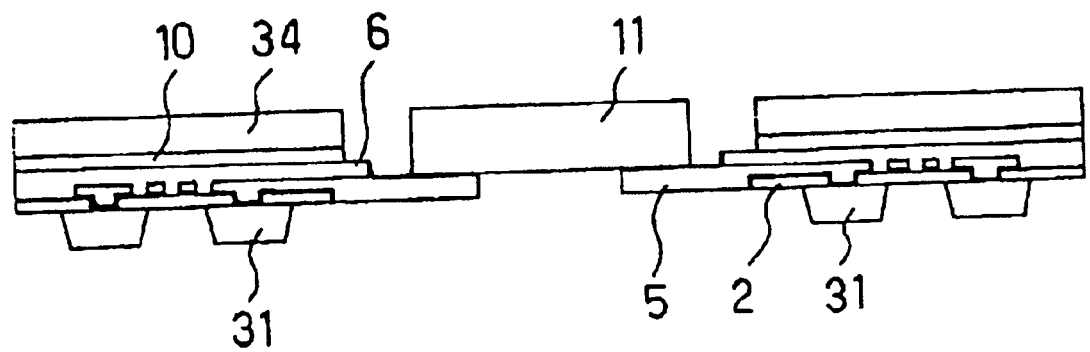

(E) As shown in FIG. 22B, each lead front end of the wiring films 5 is bonded by single point bonding to each electrode of the LSI chip 11.

Thereafter, sealing is made by a resin 12, completing the fabrication of the wiring substrate shown in FIG. 20.

Figure 23:
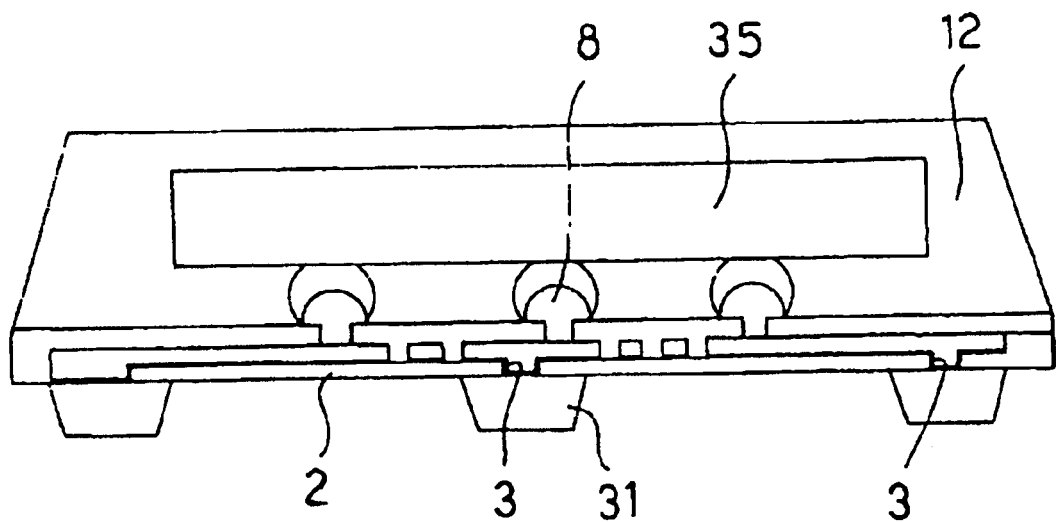
FIG. 23 is a sectional view showing a wiring substrate according to Embodiment 12 of the present invention.

FIG. 23 is a sectional view showing a wiring substrate according to Embodiment 12 of the present invention. In this embodiment, terminals 31 are formed from a basal made of a metal (copper), and wiring films 5 formed on the base 1 through an insulating film 2 are covered with an insulating film 6 that has openings 7 for forming ball electrodes. Further, ball electrodes 8 are formed in the openings 7 for forming ball electrodes by, for example. Ni—Au electroplating. The LSI chip 11 is bonded at its electrodes 35 to the ball electrodes 8 by flip chip bonding. Then, a sealing resin 12 is used for resin sealing by transfer molding.

In this wiring substrate, a pattern having the openings 7 for forming ball electrodes is formed as the insulating film 6 on the wiring films 5 to form in the openings 7 the ball electrodes 8 that are bonded to the LSI chip 11 by flip chip bonding. Aside from that, this wiring substrate and the wiring substrate in Embodiment 9 shown in FIG. 15 have common construction and fabricating method. The fabricating method of this substrate is therefore neither illustrated nor described. Also, the mounting method of the LSI chip 11 is not illustrated, for it uses normal flip chip bonding. Incidentally, the wiring films 5 may be made of copper alone, and forming gold films on their surfaces is not necessary.

The ball electrodes 8 are formed by applying solder plating on the Ni electroplating. For transfer molding, it is required to save a gap of 150 μm or more between the LSI chip 11 and the wiring substrate. To save the gap can be obtained by forming the ball electrodes 8 of solder, securing the height of the ball electrodes 8 after reflowing. The electrodes 8 are formed by applying gold electroplating in a thickness of about 0.1 to 0.3 μm. If the thickness of the gold plating film is 0.3 μm or more, an intermetallic compound is undesirably formed in solder joining. Used as the LSI chip 11 is a chip with a bump-like electrode made of solder, etc. When flip chip joining is made, the ball electrode surface on the wiring substrate side is coated with flux or solder paste and, after positioning, solder is fused by reflowing.

Figure 24:
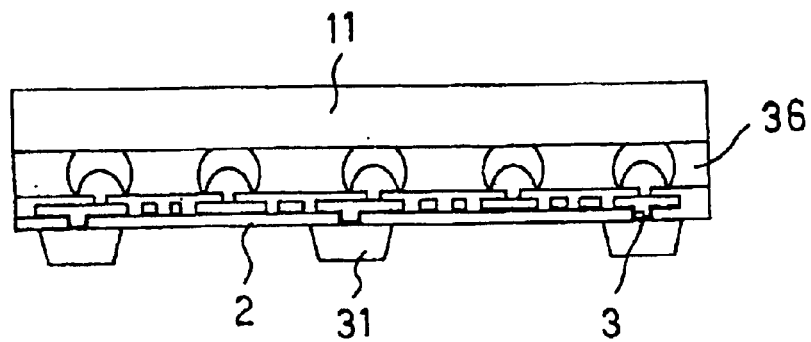
FIG. 24 is a sectional view showing a wiring substrate according to Embodiment 13 of the present invention.
Figure 25:
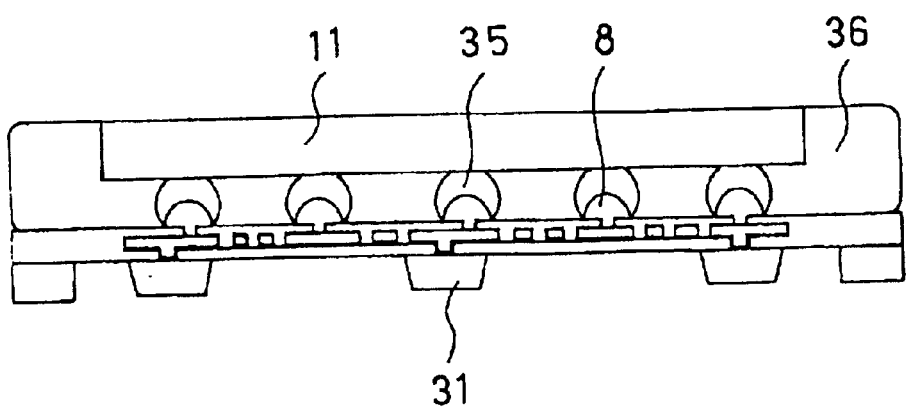
FIG. 25 is a sectional view showing the state of the wiring substrate in FIG. 24 prior to outer shape cutting.

FIG. 24 is a sectional view showing a wiring substrate according to Embodiment 13 of the present invention. This embodiment differs from Embodiment 12 solely in that a liquid resin seals only the space between an LSI chip 11 and the wiring substrate, and other points are common to these embodiments. Ball electrodes 8 are formed by applying on electroplating gold electroplating in a thickness of 0.1 to 0.3 μm. If the thickness of the gold plating film is 0.3 μm or more, an intermetallic compound is undesirably formed in solder joining. Used as the LSI chip 11 to be flip-chip-joined is a chip with a bump-like electrode made of solder, etc. When an under film made of the liquid resin is formed, a sufficient gap is needed between the wiring substrate and the LSI chip. FIG. 25 shows the state after resin sealing and before the outer shape cutting. In the resin-sealed state, the side surfaces of the LSI chip 11 are also covered with a resin 36. The resin covering the side surfaces is removed together with the outer peripheral portion of the wiring substrate by the outer shape cutting, reaching the state shown in FIG. 24. Reference symbol 33 denotes the outer peripheral portion of the base 1, which is to be cut.

Figure 26:
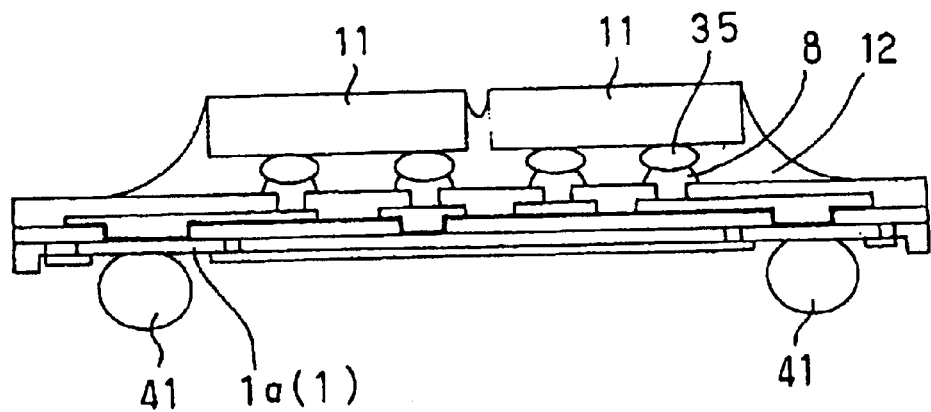
FIG. 26 is a sectional view showing a wiring substrate according to Embodiment 14 of the present invention.

FIG. 26 is a sectional view showing a wiring substrate according to Embodiment 14 of the present invention. In this embodiment, a base 1 is half-etched to be thinned, and the thinned portions denoted by 1a are patterned to form wiring films 38. Further, the wiring films 38 are covered with an insulating film 40 having openings 39 for forming ball electrodes, and ball electrodes 41 are disposed therein in post-attachment. An insulating film 6 having openings 7 for forming ball electrodes covers the wiring films 5 formed on the front surface side of the base 1 through an insulating film 2 having openings 3 for connecting upper and lower wirings. Ball electrodes 8 are formed on the openings 7 and a plurality of LSI chips 11 (two chips, in this embodiment) are bonded to one wiring substrate by flip chip bonding. The space between the LSI chips 11 and the wiring substrate is sealed with a resin 12.

According to this wiring substrate, the wiring films 38 can be formed from the base 1 by thinning the base 1 through half-etching and patterning the thinned portions and, thus, multilayered wiring may have more layers.

FIGS. 27A to 27D are sectional views showing in process order a fabricating method of the wiring substrate shown in FIG. 26.

Figure 27A:
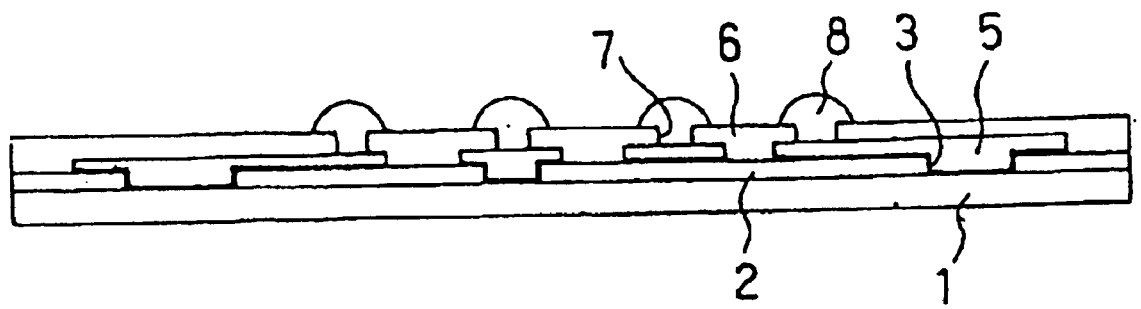
FIGS. 27A to 27D are sectional views showing in process order a fabricating method of the wiring substrate in FIG. 26.

(A) For instance, the ball electrodes 8 are formed by electroplating through processes similar to the processes shown in FIGS. 2A to 2C. FIG. 27A shows the state after the formation of the ball electrodes 8.

Figure 27B:
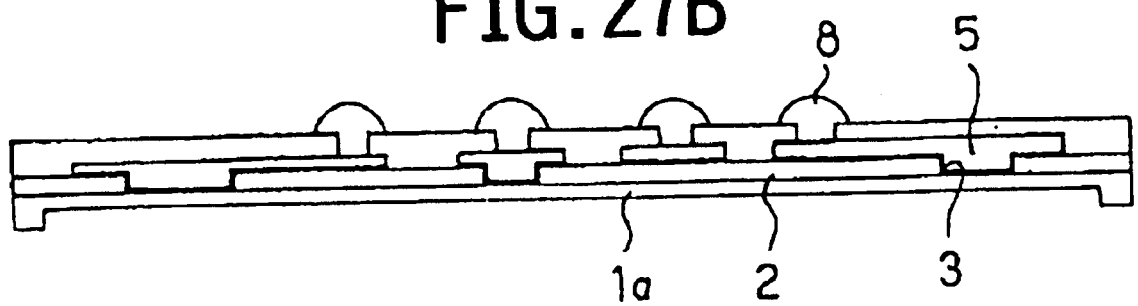

(B) As shown in FIG. 27B, the base 1 except for its outer peripheral portion is half-etched from its back surface so as to have a proper thickness (for example, several tens μm) for forming the wiring films. Reference symbol 1a denotes the thinned portions. The outer peripheral portion is left to secure the strength.

Figure 27C:
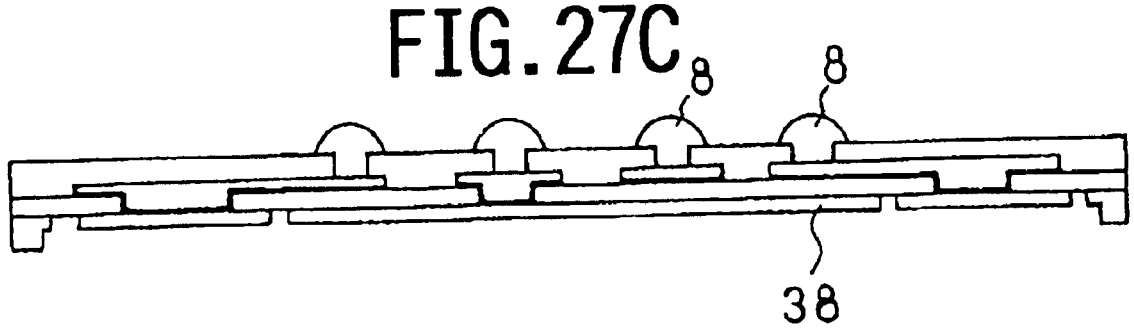

(C) As shown in FIG. 27C, the thinned portions 1a of the base 1 are selectively etched to form the wiring films 38.

Figure 27D:
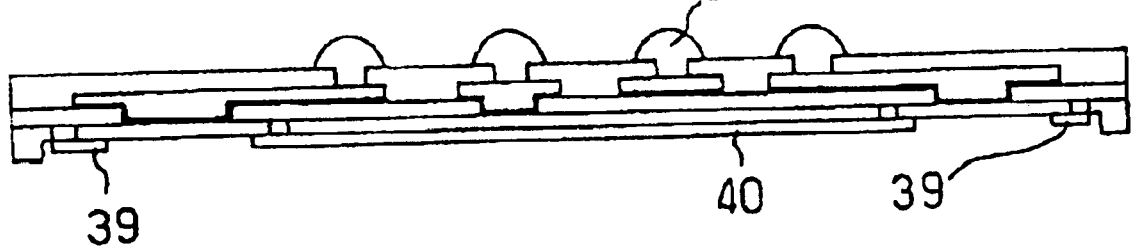

(D) As shown in FIG. 27D, the wiring films 38 are covered with the insulating film 40 having the openings 39 for forming ball electrodes. Portions of the wiring films 38, which are exposed to the openings for forming ball electrodes, are coated with electroless gold plating or solder such as super solder.

Fabrication of this wiring substrate is thus completed. Incidentally, the ball electrodes 41 are mounted in post-attachment.

Figure 28A:
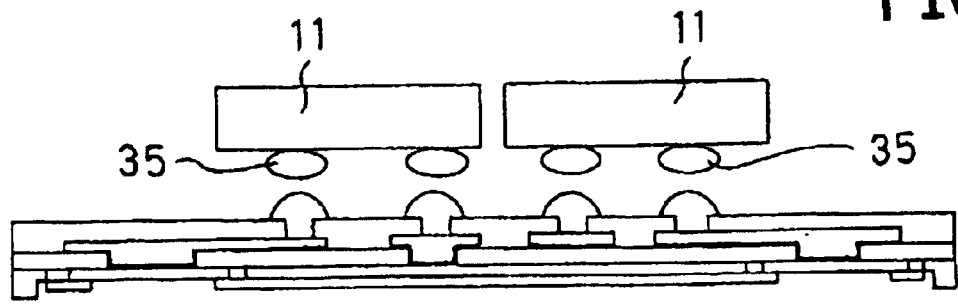
FIGS. 28A and 28B are sectional views showing in process order a mounting method of the LSI chip to the wiring substrate in FIG. 26.
Figure 28B:
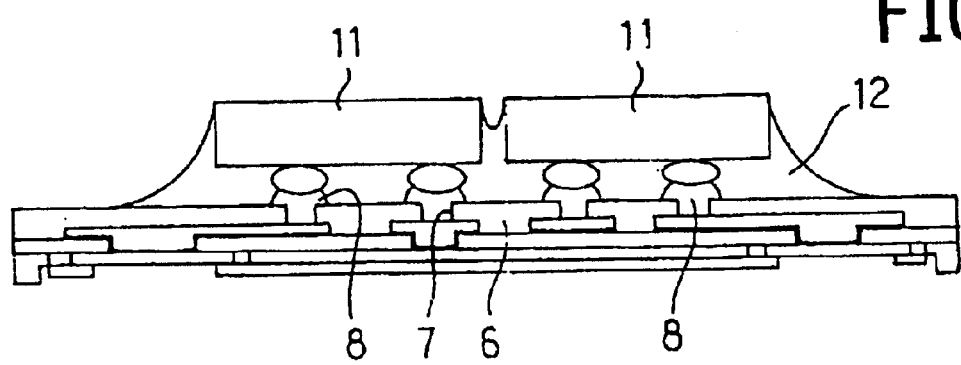

FIGS. 28A and 28B are sectional views showing in process order a mounting method of the LSI chips 11.

(A) As shown in FIG. 28A, a plurality of LSI chips 11 are bonded by flip chip bonding. Reference symbol 35 denotes electrodes of the LSI chips 11. Used as the LSI chips 11 to be flip-chip-joined are chips with bump-like electrodes made of solder, etc. This wiring substrate is suitable for mounting a plurality of LSI chips 11 because its wiring circuit has a two-layer structure, enhancing integrated density of the wiring. Then, a plurality of LSI chips 11 are mounted in this embodiment.

(B) As shown in FIG. 28B, the space between the LSI chips 11 and the wiring substrate is sealed with the resin 12. Incidentally, it is sufficient if the LSI chips 11 and the wiring substrate have a gap of about 100 μm therebetween.

The ball electrodes 41 are then attached to the openings 39 for forming ball electrodes. This completes the fabrication of the wiring substrate shown in FIG. 26.

Figure 29:
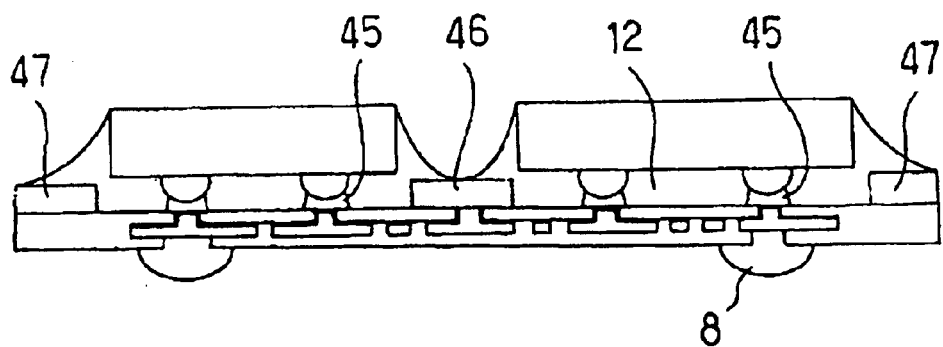
FIG. 29 is a sectional view showing a wiring substrate according to Embodiment 15 of the present invention.

FIG. 29 is a sectional view showing a wiring substrate according to Embodiment 15 of the present invention. In this embodiment, ball electrodes formed on the front surface side are not used for flip chip bonding of an LSI chip but used for connection with a printed wiring or the like, and terminals 45 are formed by selectively etching a base 1 to use as electrodes for flip chip bonding of the LSI chip. Through the selective etching of the base 1, in addition to the terminals 45, a dam/ground terminal 46 and reinforcers/dams 47 are formed at the same time. The dam/ground terminal 46 and the reinforcers/dams 47 act to dam back the flow of a resin upon resin a aling by potting. Namely, they act as dams. Further, the dam/ground terminal 46 also serves as a ground and the reinforcers/dams 47 also serve as reinforcement means for the wiring substrate.

Figure 30A:
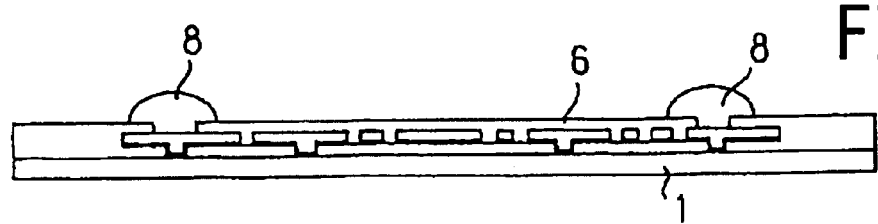
FIGS. 30A and 30B are sectional views showing in process order a fabricating method of the wiring substrate in FIG. 29.
Figure 30B:
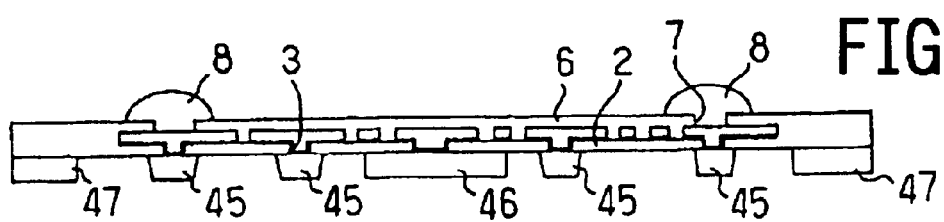

FIGS. 30A and 30B are sectional views showing in process order a fabricating method of the wiring substrate shown in FIG. 29.

(A) For instance, through processes similar to the processes shown in FIGS. 2A to 2C, the state in which ball electrodes 8 are formed as shown in FIG. 30A is obtained.

(B) As shown in FIG. 30B, by selectively etching the base 1 from its back surface, the terminals 45 to which the LSI chips 11 are bonded by flip chip bonding, the dam/ground terminal 46 and the reinforcers/dam terminals 47 are formed at once.

Figure 31A:
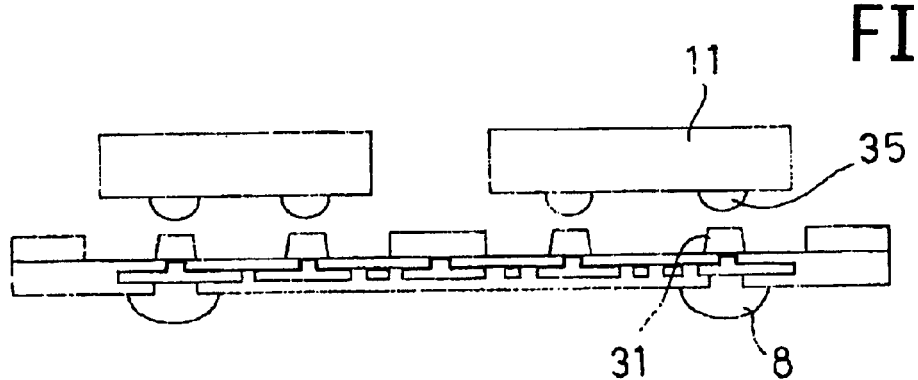
FIGS. 31A and 31B are sectional views showing in process order a mounting method of the LSI chip to the wiring substrate in FIG. 29.
Figure 31B:
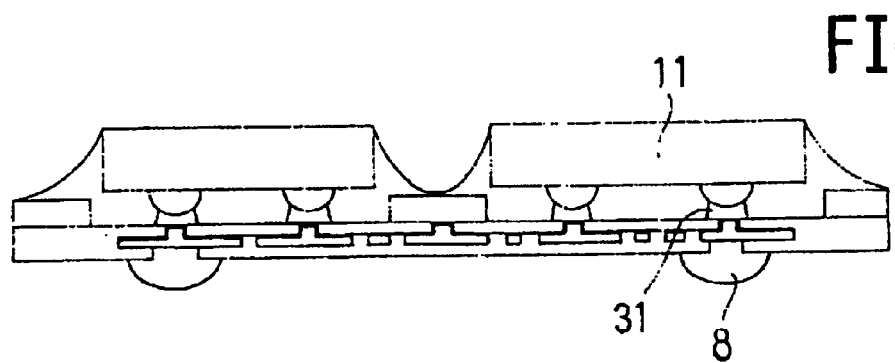

FIGS. 31A and 31B are sectional views showing in process order a mounting method of the LSI chip 11.

(A) As shown in FIG. 31A, electrodes 35 of the LSI chip 11 (a plurality of LSI chips, in this embodiment) are bonded by flip chip bonding to the terminals 45 formed from the base 1. That is, flip chip bonding.

(B) As shown in FIG. 31B, the space between the LSI chips 11 and the wiring substrate is sealed with a resin 12.

This completes the fabrication of the wiring substrate shown in FIG. 29.

Figure 32:
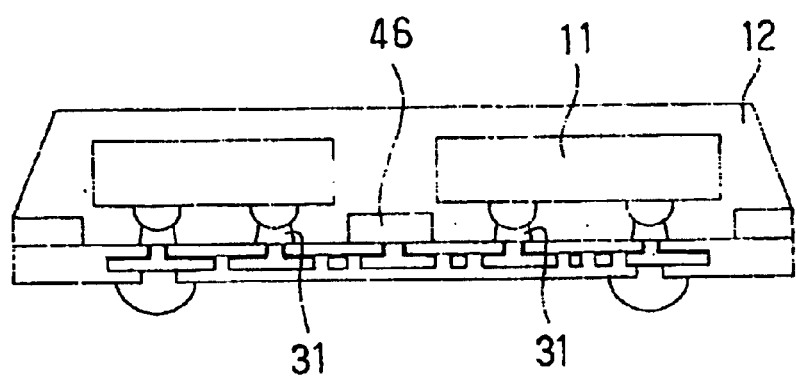
FIG. 32 is a sectional view showing a wiring substrate according to Embodiment 16 of the present invention.

FIG. 32 is a sectional view showing a wiring substrate according to Embodiment 16 of the present invention. This embodiment does not differ from Embodiment 15 except that the wiring substrate here is sealed by transfer molding.

Figure 33:
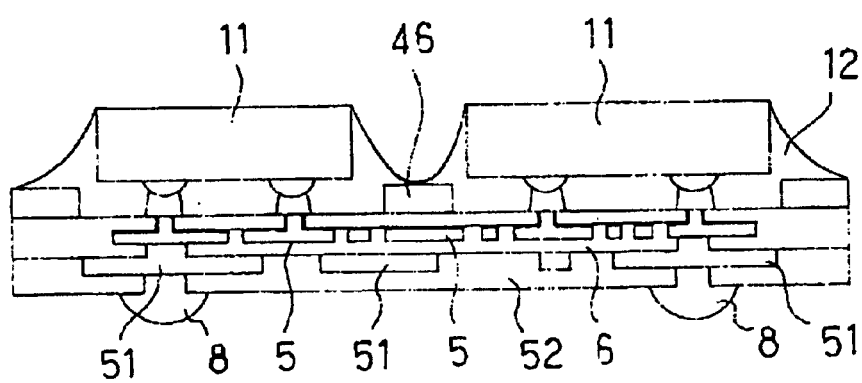
FIG. 33 is a sectional view showing a wiring substrate according to Embodiment 17 of the present invention.

FIG. 33 is a sectional view showing a wiring substrate according to Embodiment 17 of the present invention. In this embodiment, wiring films 51 are further formed on the insulating film 6 to increase from one to two the number of the layers of the wiring that is formed on one side of the base 1 where the insulating film 2 is formed. This embodiment is thus capable of further enhancing formation density of the wiring. Reference symbol 52 denotes an insulating film covering the wiring films 51, and the ball electrodes 8 are formed in the openings of this insulating film.

To make the base front side wiring have two layers, as above, the insulating film 6 is selectively formed, a Ni film is then formed over the entire surface by electroless plating, a plating resist film is selectively formed to form the wiring films 51 made of copper by electroplating, the resist film is removed and the Ni film is then removed to make each of the wiring films 51 independent. If such processes are repeated, the wiring layers may have more than two layers.

FIGS. 34A to 34D are sectional views showing in process order a fabricating method of a wiring substrate according to Embodiment 18 of the present invention.

Figure 34A:
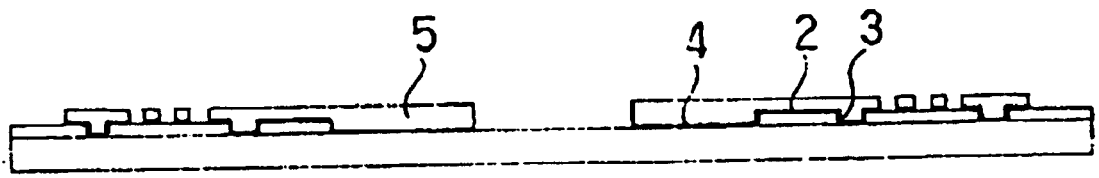
FIGS. 34A to 34D are sectional views showing in process order a fabricating method of a wiring substrate according to Embodiment 18 of the present invention.

(A) One main surface (front side surface) of a base 1 made of copper is coated with an insulating film 2 having photosensitivity. The photosensitive insulating resin layer 2 is then patterned by exposure and development to have openings 3 for connecting upper and lower wirings and to have a pattern that does not cover portions that will be later bond d to electrodes of an LSI chip. Thereafter, for instance, a Pd activation treatment is performed to form over the entire surface a conductive layer 4 (metallized layer) by electroless Ni—P plating or the like. Using a resist film as a mask, wiring film, 5 are formed on the surface of the base 1. After removing the resist film used as a mask, the conductive layer 4, which has been formed over the entire surface prior to the removal of the resist film, is lightly etched and removed. This causes the wiring films 5 to avoid short circuit mutually. FIG. 34A shows the state after the removal.

Figure 34B:
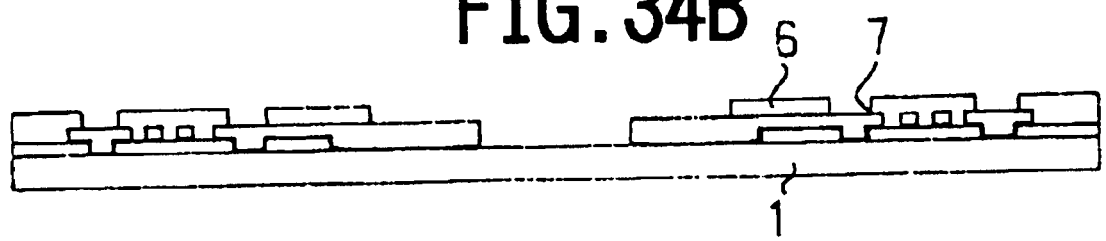

(B) A second insulating film 6 is then formed. The second insulating film 6 has openings 7 for forming ball electrodes, and has a pattern that does not cover portions of the wiring films 5 made of copper, the portions later being lead front ends to be connected to electrodes of the LSI chip. FIG. 34B shows the state after the formation of the insulating film 6.

Figure 34C:
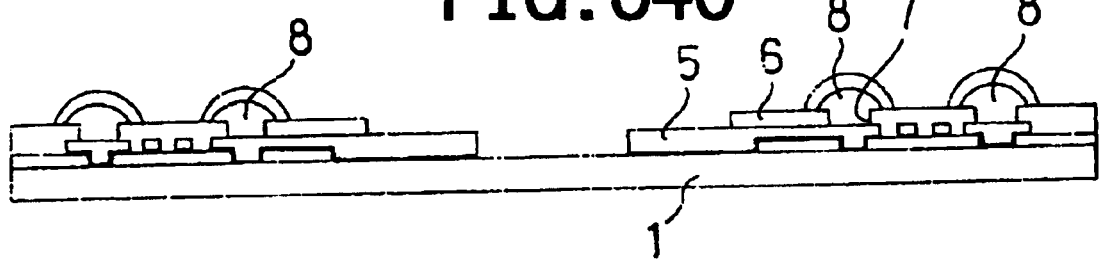

(C) Ball electrodes 8 are formed by electroplating in the openings 7 for forming ball electrodes. The ball electrodes 8 each consist of, for example, a Ni plating film and a gold plating film. FIG. 34C shows the state after the ball electrodes 8 are formed.

Figure 34D:
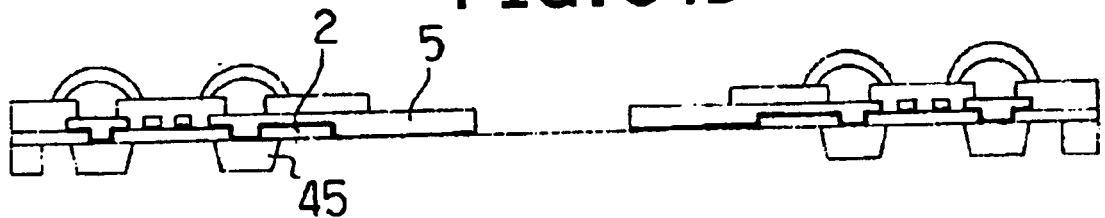

(D) The back side of the base 1 is selectively etched, using as a mask a resist film, to expose portions of the wiring films 5 which are to be connected with the electrodes of the LSI chip (through this, a device hole to naturally formed). Formed at the same time are terminals 45 made from the base 1. Then, terminal surface treatment is applied. FIG. 34D shows the thus fabricated wiring substrate.

Figure 35A:
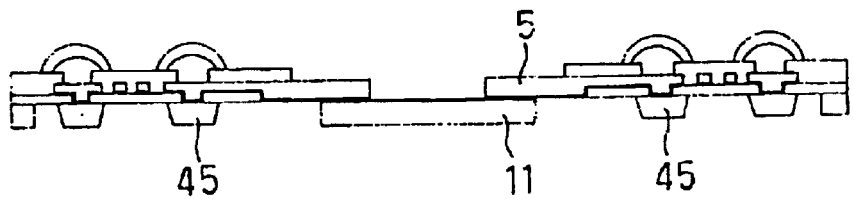
FIGS. 35A and 35B are sectional views showing in process order a mounting method of the LSI chip to the wiring substrate fabricated by the method shown in FIGS. 34A to 34D.
Figure 35B:
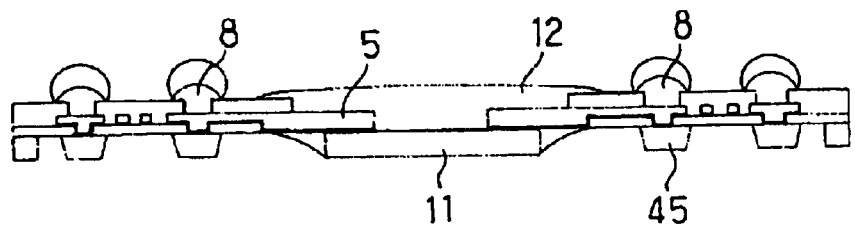

Subsequently, the LSI chip 11 is mounted as shown in FIGS. 35A and 35B.

(E) As shown in FIG. 35A, each electrode of the LSI chip 11 is joined to corresponding internal end of the wiring films 5 by single point bonding.

(F) As shown in FIG. 35B, a resin 12 is used for sealing. With this, one wiring substrate with the LSI chip 11 mounted thereto is finished.

A multi-stage wiring substrate may be obtained by layering a plurality of such wiring substrates and connecting one another the wiring substrates with solder reflowing.

Figure 36A:
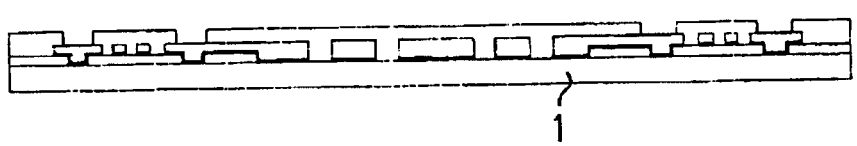
FIGS. 36A to 36C are sectional views showing in process order a fabricating method of a wiring substrate according to Embodiment 19 of the present invention.
Figure 36B:
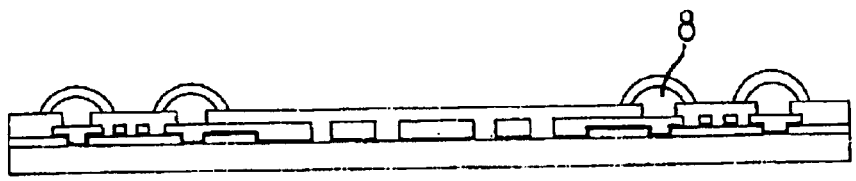
Figure 36C:
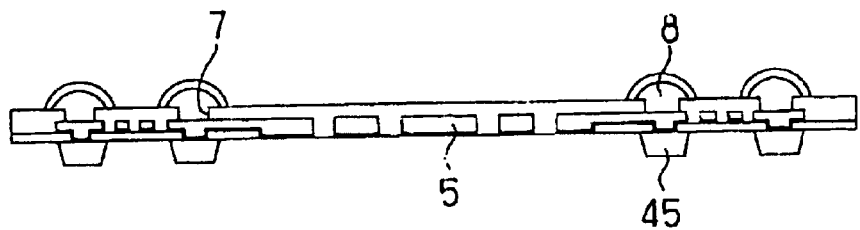

FIGS. 36A to 36C are sectional views showing in process order a fabricating method of a wiring substrate according to Embodiment 19 of the present invention.

(A) After wiring films 5 are formed through processes similar to the ones shown in FIG. 34A, a second insulating film 6 is formed. FIG. 36A shows the state after the formation of the insulating film 6.

(B) Ball electrodes 8 are formed by electroplating in openings 7 for forming ball electrodes. The ball electrodes 8 each consist of, for example, a Ni plating film and solder. FIG. 36B shows the state after the formation of the ball electrodes 8.

(C) The back side of a base 1 is selectively etched to form terminals 45 made from the base 1. Then, terminal surface treatment is applied. FIG. 36C shows the thus fabricated wiring substrate.

Figure 37A:
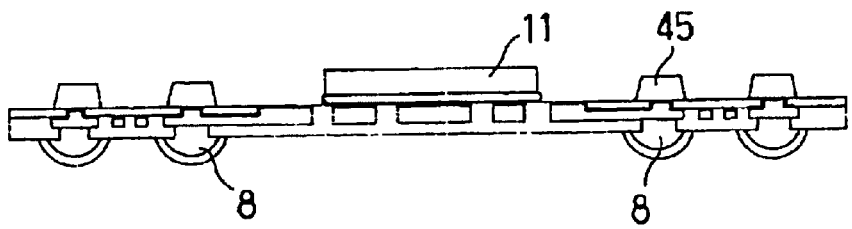
FIGS. 37A to 37C are sectional views showing in process order a mounting method of the LSI chip to the wiring substrate fabricated by the method shown in FIGS. 36A to 36C.
Figure 37B:
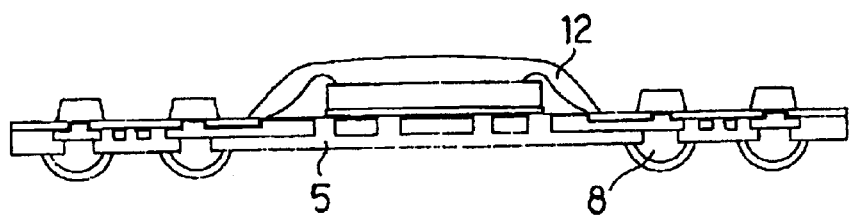
Figure 37C:
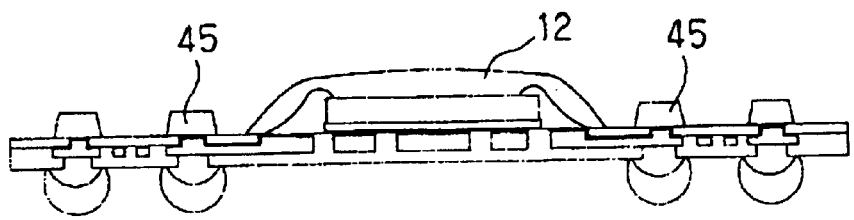

Subsequently, an LSI chip 11 is mounted as shown in FIGS. 37A to 37C.

(D) As shown in FIG. 37A, the LSI chip 11 is bonded by die bonding to the back surfaces of an insulating film 2 and of the wiring films 5, which are exposed by the selective etching of the base 1 of the wiring substrate.

(E) As shown in FIG. 37B, the wiring films 5 and electrodes of the LSI chip 11 are bonded to each other by wire bonding and, then, the LSI chip 11 and the wire bonding portion are sealed with a resin 12.

(F) As shown in FIG. 37C, the ball electrodes 8 of solder are subjected to reflowing. With this, one wiring substrate with the LSI chip 11 mounted thereto is finished.

A multi-stage wiring substrate may be obtained by layering a plurality of such wiring substrates and connecting one another the wiring substrates with solder reflowing.

In other embodiments than Embodiment 17, also, the wiring formed on the surface of the base 1 may be multilayered wiring. Also, in the embodiments in which the wiring films are formed from thinned portions of the base 1 and are covered with the insulating film, a wiring film of a single layer or multilayered wiring film may be further formed on the insulating film.

Figure 38:
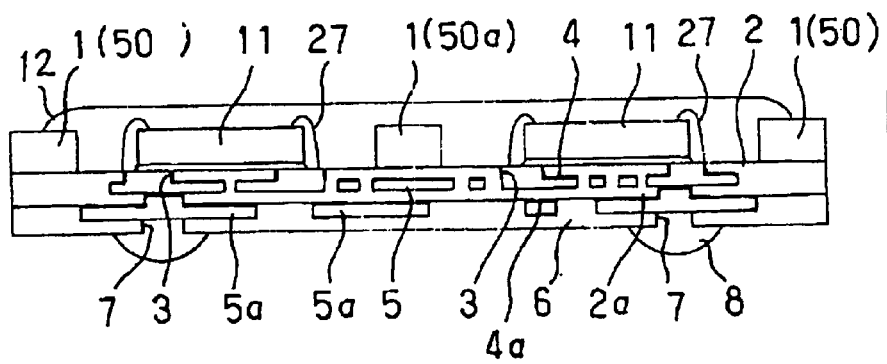
FIG. 38 is a sectional view showing a wiring substrate according to Embodiment 20 of the present invention.

FIG. 38 is a sectional view showing a wiring substrate according to Embodiment 20 of the present invention. A base 1 made of copper is selectively etched to form surrounding walls 50, 50a for surrounding LSI chip mounting regions. In particular, the surrounding wall 50a, that separates a plurality of LSI chip mounting regions, also serves as a ground line.

An insulating film 2 formed on the surface of the base 1 has openings 3. Reference symbol 4 denotes a metallized film; 5, wiring films (first layer wiring film) made of copper and formed by electroplating; 2a, an insulating,film for covering the wiring films 5; 3a, openings in the insulating film 2a; 4a, another metallized film; and 5a, wiring films (second layer wiring film) made of copper and formed by electroplating. An insulating film 6 for covering multilayered wiring consisting of the first and second layer wiring films have openings 7 for forming bumps. Ball electrodes 8 are formed in the openings 7. This wiring is multilayered wiring and the wiring of each layer can be formed in the same manner as, for example, the wiring formation method of the wiring substrate according to Embodiment 1 of the present invention shown in FIG. 1, only repeating the process twice.

LSI chips 11 are bonded by die bonding in the respective LSI chip mounting regions that are surrounded by the surrounding walls 50, 50a formed by the selective etching of the base 1. Concretely, the LSI chips 11 are bonded by die bonding to the exposed surfaces of the insulating film 2 and wiring films 5 which are exposed by the etching of the bas 1, electrodes of the LSI chips 11 and the wiring films 5 are bonded by wires 27, respectively, and the LSI chips 11 and the wire bonding portion are sealed by a resin 12.

Figure 39A:
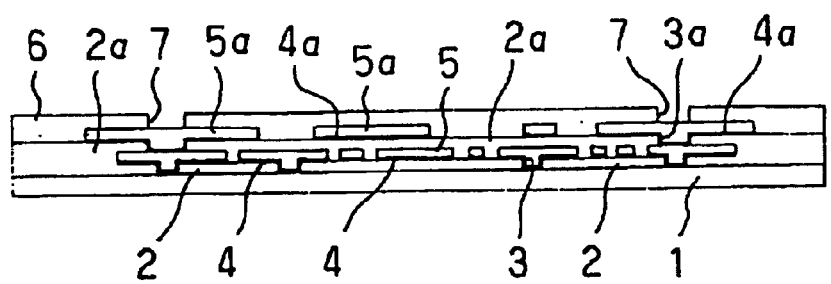
FIGS. 39A to 39C are sectional views showing in process order a fabricating method of the wiring substrate shown in FIG. 38, before mounting of the LSI chip.
Figure 39B:
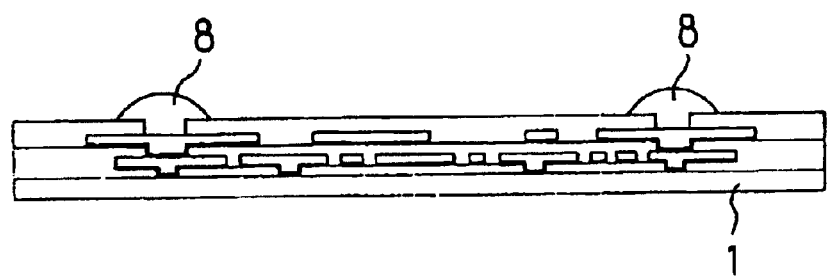
Figure 39C:
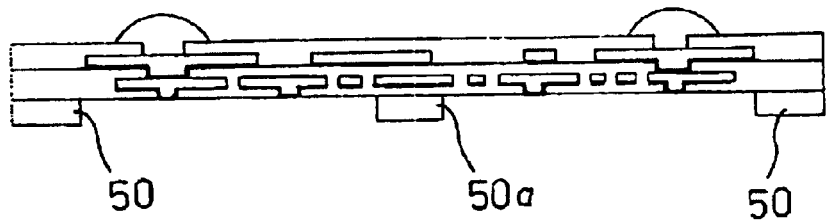

FIGS. 39A to 39C are views showing in process order a fabricating method of the wiring substrate shown in FIG. 38.

(A) After forming on the base 1 the insulating film 2 having the openings 3, the wiring films 5 by copper electroplating are formed through, for example, the same method that is used to form the wiring substrate shown in FIG. 1. Further, formation of the wiring films 5a follows forming of the insulating film 2a that has the openings 3a. The insulating film 2a and the wiring films 5a are formed by the same method that is used to form the insulating film 2 and the wiring films 5. Formed after that is the insulating film 6 having the openings 7 for forming bump electrodes. FIG. 38A shows the state after the insulating film 6 is formed.

(B) As shown in FIG. 39B, the ball electrodes 8 are formed in the openings 7 for forming bumps.

(C) As shown in FIG. 39C, the base 1 is selectively etched to form the surrounding walls 50, 50a. This completes the fabrication of the wiring substrate.

Figure 40A:
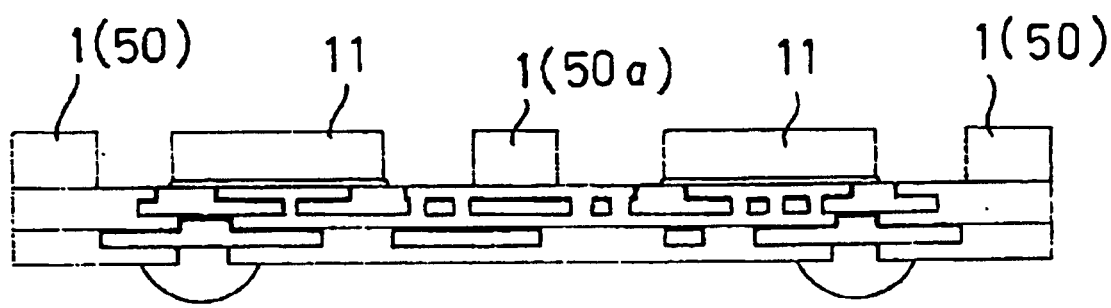
FIGS. 40A and 40B are sectional views showing in process order a mounting method of the LSI chip to the wiring substrate shown in FIG. 38.
Figure 40B:
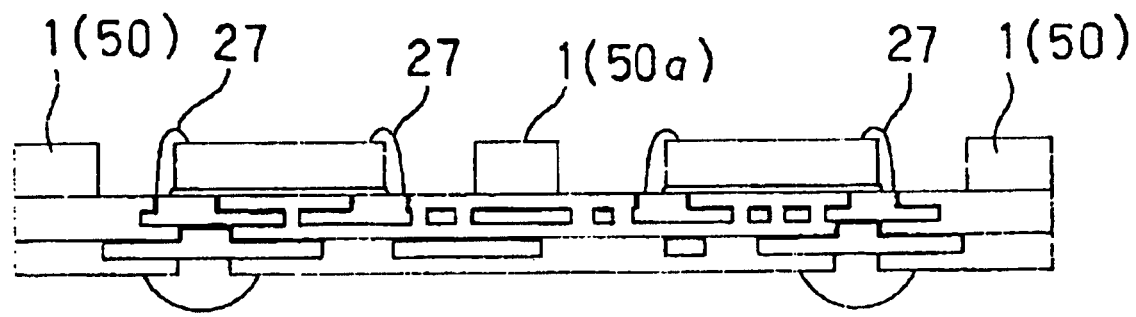

FIGS. 40A and 40B are sectional views showing in process order a mounting method of the LSI chips to the wiring substrate thus fabricated.

(D) As shown in FIG. 40A, the LSI chips 11, 11 are bonded in the respective LSI chip mounting regions surrounded by the surrounding walls 50, 50*a* that are formed by the selective etching of the base 1.

(E) As shown in FIG. 40B, the wiring films 5 and the electrodes of the LSI chips 11 are bonded to each other by the wires 27.

When sealing is made with the resin 12, the state shown in FIG. 38 to obtained.

FIGS. 42A to 42D and FIGS. 43A to 43D are sectional views showing in process order one of fabricating methods of a wiring substrate according to Embodiment 21 of the present invention.

Figure 42A:
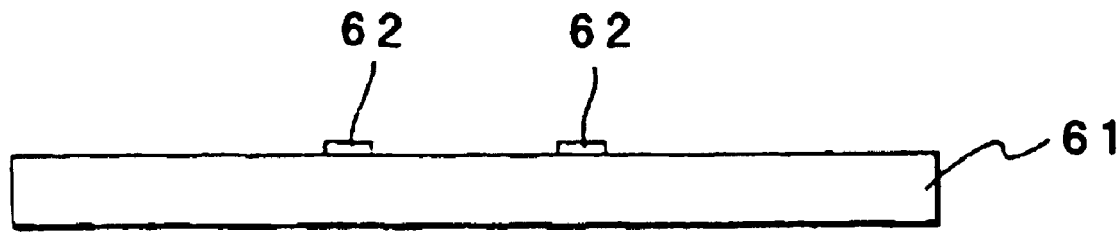
FIGS. 42A to 42D are sectional views showing in process order a fabricating method of a wiring substrate according to Embodiment 21 of the present invention.

(A) A base metal 61 made of, for example, copper or an copper alloy is prepared. On one surface (front side) of the base metal 61, first solder films 62 are selectively formed. The solder films 62 are formed by, for example, patterning a photoresist film through exposure and development and by electroplating with the use of this photoresist film as a mask. Positions where the solder films 62 are formed correspond to positions where lower ones of metal bumps having two kinds of height, which will be described later, are to be formed. FIG. 42A shows the state after the solder films 62 are formed.

Figure 42B:
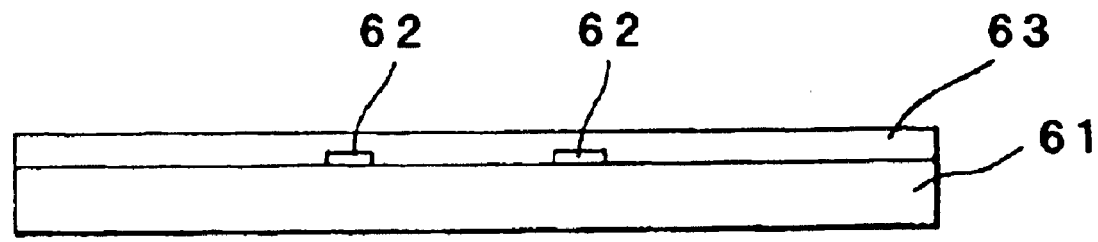
Figure 42C:
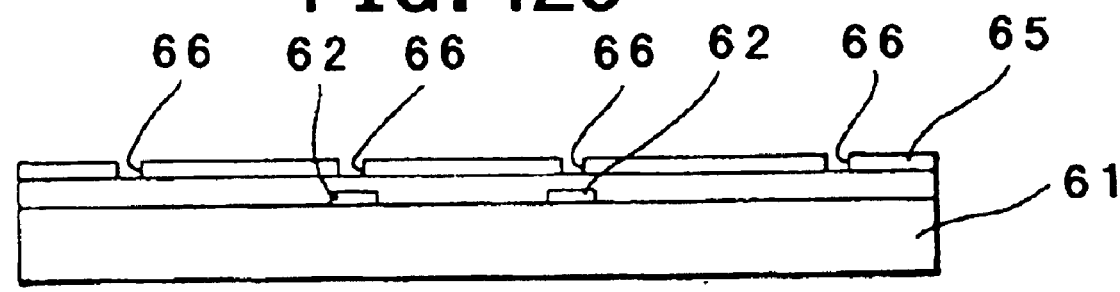

(B) Next, on the surface of the base metal 61, which is the side mentioned above and includes the portions where the solder films 62 are formed, a copper film 63 that is thicker, to a suitable extent, than the solder films 62 is formed by overall plating. FIG. 42B shows the state after the copper film 63 is formed.

(C) Formed next on the copper film 63 is a film made of an insulating resin, for example, a polyimide film 65, which is selectively etched to have openings 66. The openings 66 are openings for connecting the base metal 61 to wiring films to be formed later, that is, openings for connecting the upper to the lower. The opening 66 are located at positions corresponding to portions where lower metal bumps are formed and at positions corresponding to portions where higher metal bumps are formed, the bumps being described later.

Figure 42D:
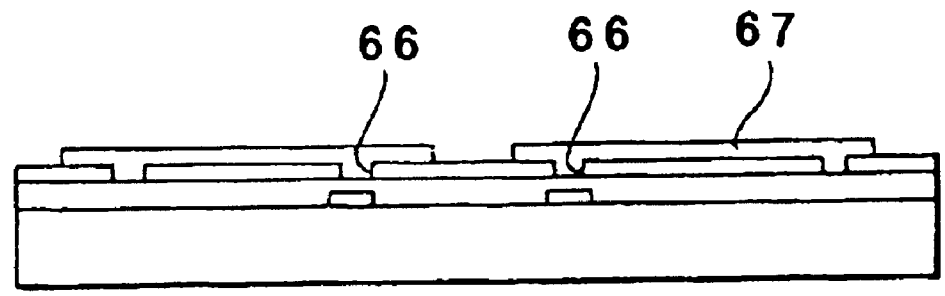

(D) Wiring films 67 made of, for example, copper are then formed on the polyimide film 65 by electroless plating and electroplating. To be concrete, Pd activation treatment, for example, is applied and, thereafter, a thin conductive layer is formed over the entire surface by Ni—P electroless plating or the like. A photoresist film having a pattern negative to a pattern to be formed is further formed. The photoresist film to removed after it is used as a mask to form the wiring films 67 by copper plating. Then, using the wiring films 67 as masks, the thin conductive layer is etched to complete the wiring films 67. FIG. 42D shows the state after the wiring films 67 are formed.

Figure 43A:
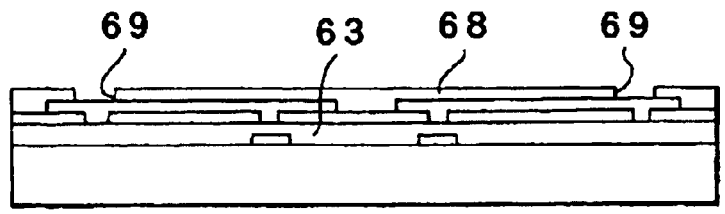
FIGS. 43A to 43D are sectional views showing in process order a fabricating method of the wiring substrate according to Embodiment 21 of the present invention.

(E) Subsequently, insulating films 68 made of an insulating resin are selectively formed on the wiring films 67. The insulating films 68 have openings 69 at which portions to be terminal portions connected by wires to electrodes of LSI chips are exposed. FIG. 43A shows the state after the formation of the insulating films 68 having the openings 69.

Figure 43B:
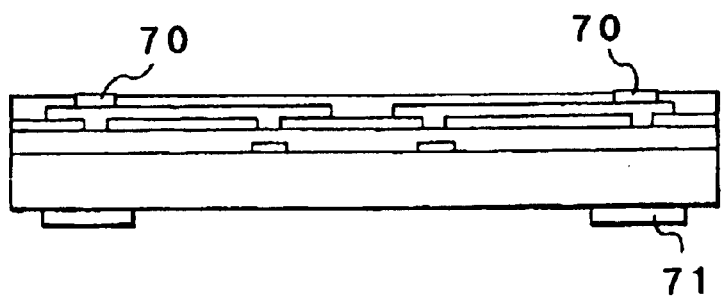

(F) After that, solder films 70, 71 are form d by plating, respectively, at the portions to be exposed through the openings 69 of the insulating films 68 and at the portions on the other surface (back side) of the base metal 61, where higher metal bumps described later are to be formed. FIG. 43B shows the state after the solder films 70, 71 are formed. The solder films 70 denote solder films that are formed on the portions to be exposed through the openings 69 of the insulating films 68, and the solder films 71 denote solder films that are formed on the back side surface of the base metal 61.

Figure 43C:
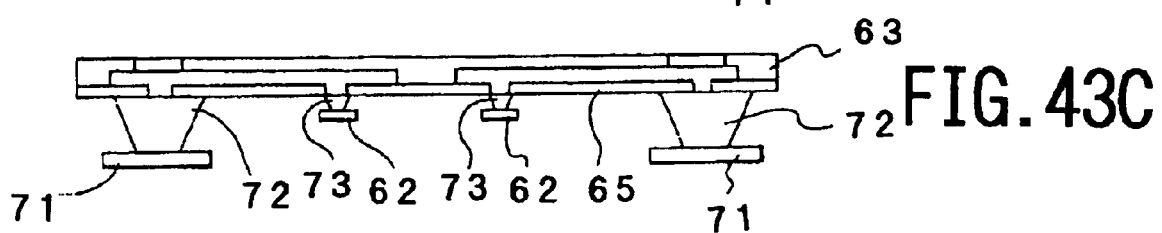

(G) Next, an etchant that can not erode the solder films 62, 71 but can erode copper it used to etch the base metal 61 and the copper film 63 from their back sides. In other words, carried out here is the selective etching of the base metal 61 and the copper film 63 with the use of the solder films 62, 71 as masks. As shown in FIG. 43C, this results in formation of the metal bumps 72 made of the base metal 61 and the copper film 63 on portions covered with the solder films 71, and formation of the metal bumps 73 made of the copper film 63 on portions covered with the solder films 62. The metal bumps 72, being made of the base metal 61 and the copper film 63, have the height roughly equal to the sum of the thickness of the base metal 61 and the thickness of the copper film 63, and thus are higher in height. In contrast, the metal bumps 73, being made solely of the copper film 63, have the height roughly equal to the thickness of the copper film 63, and thus are lower in height.

Figure 43D:
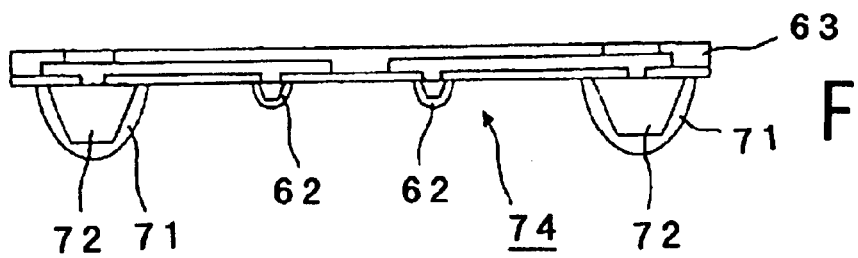

(H) Then, the solder films 62, 71 covering the metal bumps 72, 73 are shaped by reflowing treatment to finish the fabrication of a wiring substrate 74 as shown in FIG. 43D.

Namely, in the wiring substrate 74, the wiring films 67 are formed on one side (front side) of the insulating resin film (polyimide) 65 having the openings 66. On the wiring films 67, the insulating films 68 having the openings 69 at which terminal portions connected to the electrodes of the LSI chips are exposed, which will be described later, are formed, and the solder films 70 are formed in the openings 69.

Formed on the other side (back side) of the insulating resin film 65 are the metal bumps 72, 73 which are electrically connected to the wiring films 67 through the openings 66, and which have different height from each other. The metal bumps 72, 73 are covered with the solder films 62, 71. The lower metal bumps 73 may be used for flip chip bonding of the LSI chips, and the higher metal bumps 72 may be used as external terminals of the wiring substrate 74.

FIGS. 44A to 44D are sectional views showing in process order a mounting method of LSI chips 75, 76 to the wiring substrate 74 shown in FIG. 43D.

Figure 44A:
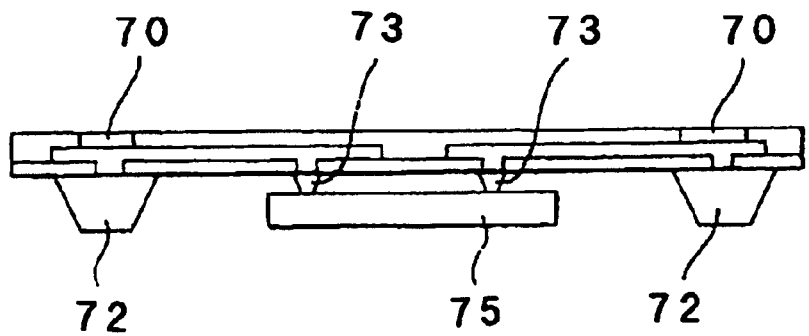
FIGS. 44A to 44D are sectional views showing in process order a mounting method of two LSI chips to the wiring in substrate according to Embodiment 21 of the present invention.
Figure 44B:
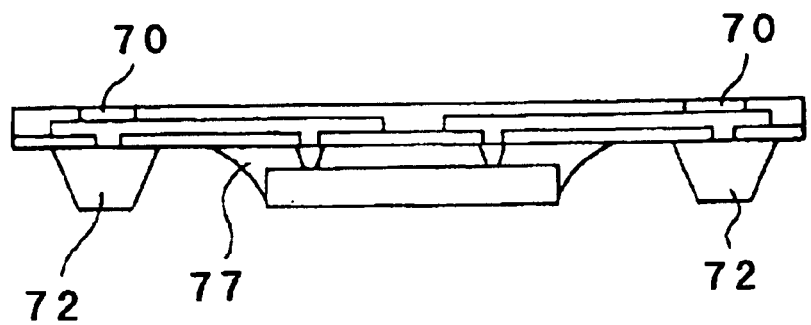

(A) The LSI chip 75 is mounted, at the lower metal bumps 73, to the back side of the wiring substrate 74 by flip chip bonding. FIG. 44A shows the state after flip chip bonding of the LSI chip 75.

(B) As shown in Pig. 44B, the space between the wiring substrate 74 and the LSI chip 75 is sealed with a r sin 77.

Figure 44C:
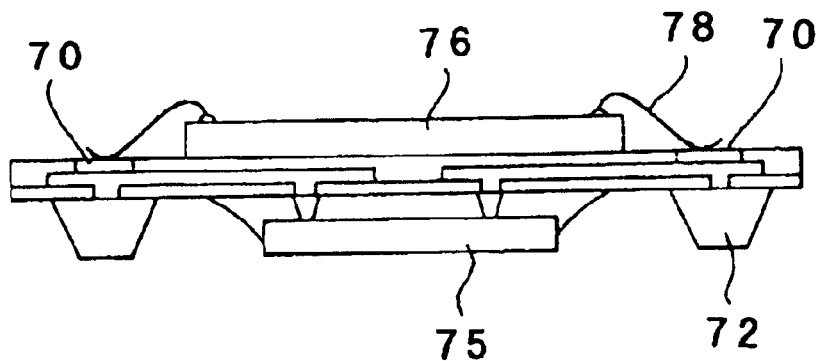

(C) Thereafter, the LSI chip 76 is bonded to the front side of the wiring substrate 74. Each electrode of the LSI chip 76 is connected with wires 78 to each of the solder films 70 that are the terminals of the wiring films 67. FIG. 44C shows the state after the wire bonding.

Figure 44D:
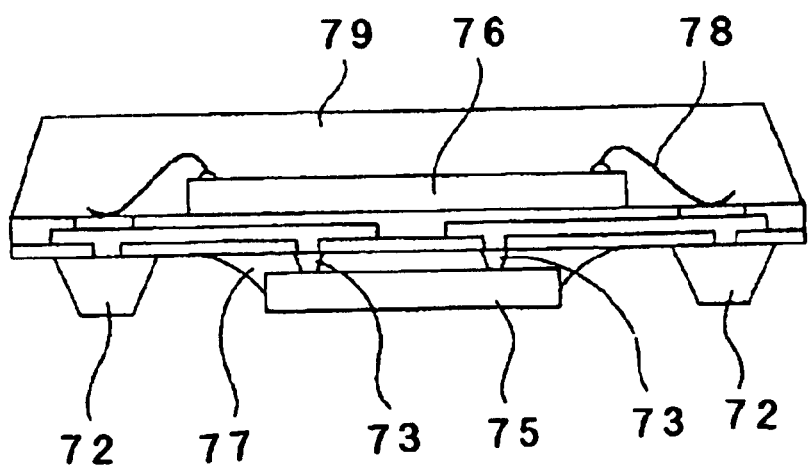

(D) As shown in FIG. 44D, the LSI chip 76 is sealed with a resin 79.

According to the wiring substrate 74, the wiring films 77 are formed on the front side of the insulating resin film (polyimide) 75 having the openings 66 for communicating the upper to the lower wirings, and two kinds of metal bumps 72, 73, that are connected to the wiring films 67 through the openings 66 and different in height from each other, are formed on the back side of the insulating resin film 65. Therefore, the LSI chips may be mounted on both sides of the insulating resin film 65: chips 75, 76 on the back side and the front side, respectively, enhancing the mounting density of the wiring substrate 74.

The wiring substrate 74 shown in FIG. 43D has wiring of single layer on the front side of the insulating resin film 65. However, the wiring may be two-layer wiring or multilayered wiring having more than two layers.

Figure 45A:
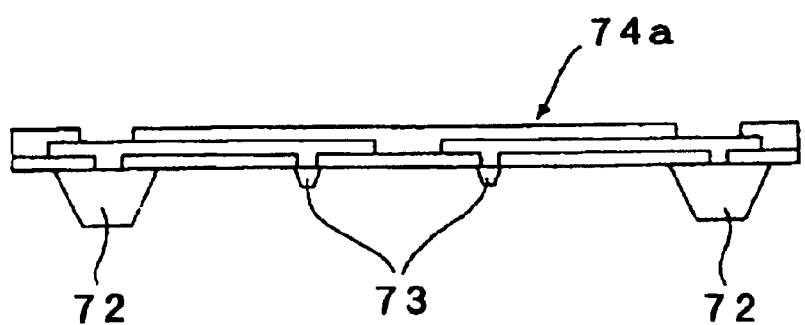
FIG. 45A is a sectional view showing an example of a wiring substrate in which, after completion of the etching process, a solder film used as a mask is removed by peeling.
Figure 45B:
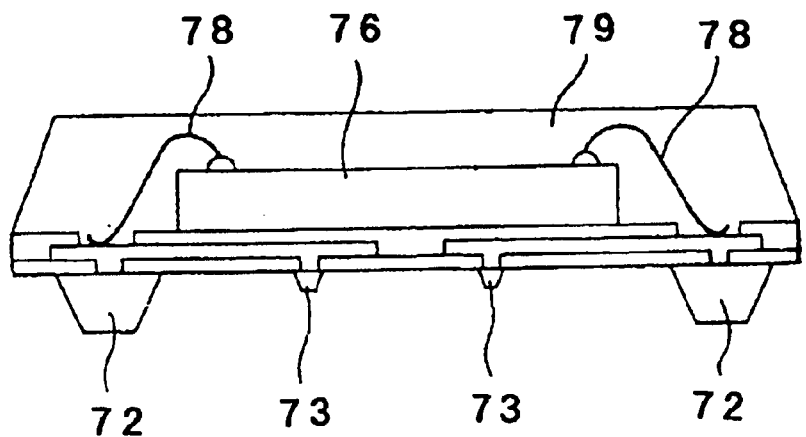
FIG. 45B is a sectional view showing a state in which one LSI chip is mounted on that wiring substrate.

In the fabricating method of the wiring substrate 74, after the completion of the etching process shown in FIG. 43C, the metal bumps 72, 73 are shaped so as to have a shape covered with solder at the process of performing reflowing treatment on the solder films 62, 71 shown in FIG. 43D. However, this is not always indispensable, and the solder films 62, 71 may be peeled and removed after completion of the etching process. FIG. 45A is a sectional view showing an example of a wiring substrate 74a from which the solder films 62, 71 have been peeled off as in the description above. FIG. 45B is a sectional view showing an example in which one LSI chip 76 is mounted to the wiring substrate 74a.

Figure 46:
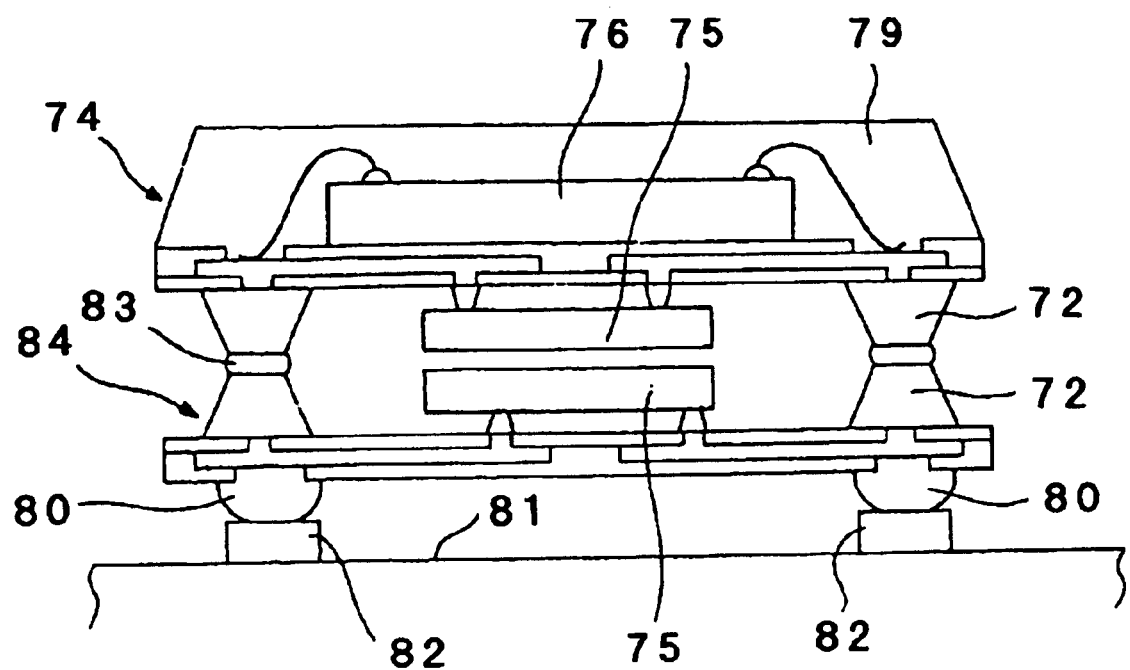
FIG. 46 is a sectional view showing an application example wherein a plurality of wiring substrates are assembled.

FIG. 46 is a sectional view showing an application example in which two wiring substrates 74 and 84, are layered. The wiring substrate may be used also in such a mode. The wiring substrate 74 is the same as the one shown in FIG. 43D, but the wiring substrate 84 has solder bumps 80 formed instead of the solder films 70 of the wiring substrate 74. On the back surface sides of the wiring substrates 74, 84, LSI chips 75 are mounted at lower metal bumps 73, respectively. While an LSI chip 76 is mounted on the front side of the wiring substrate 74, the front side of the wiring substrate 84 is provided not with the LSI chip 76 but with the solder bumps 80, which are used as connection terminals with wiring films 82 of a printed wiring substrate 81. Further, higher metal bumps 72 of the wiring substrate 74 and higher metal bumps 72 of the wiring substrate 84 are joined to each other by solder 83, or the like. In this way, the wiring substrates are layered to form a plurality of layers, thereby even further improving the mounting density.

Figure 47:
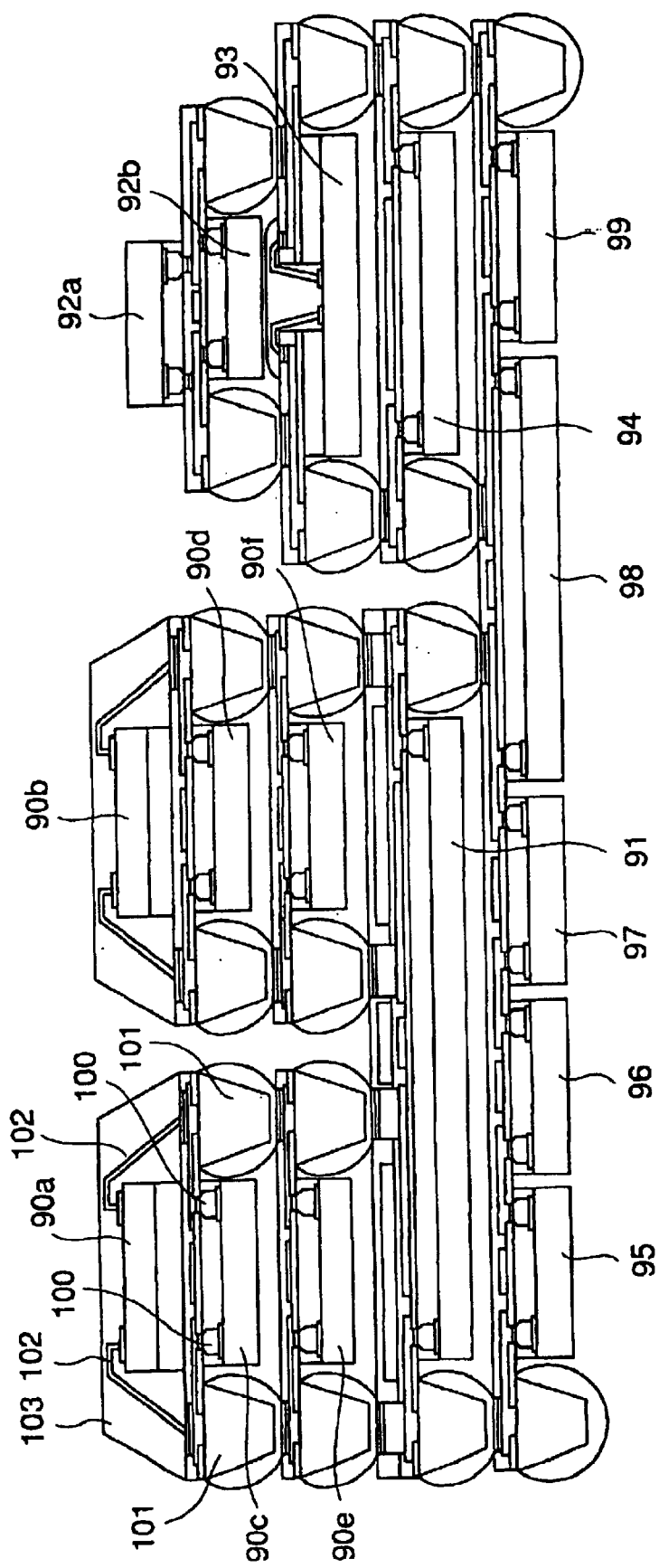
FIG. 47 is a sectional view showing an application example wherein a plurality of wiring substrate are assembled.

FIG. 47 is a sectional view showing an application example wherein a plurality of wiring substrate are assembled at 4-steps. As shown in FIG. 47, as LSI chips, Dynamic Random Access Memories (DRAMs) 90a, 90b, 90c, 90d, 90e, 90f, a DRAM controller 91, a Static RAMs (SRAMs) 92a, 92b, a flash memory 93, a Digital Signal Processor (DSP) 94, a serial interface 95, a timer 96, a bus controller 97, a Moving Picture Experts Group (MPEG) 98, an IEEE 1394 serial interface 99 are provided, and each wiring substrate has lower metal bumps 100 and higher metal bumps 101. DRAMs 90a and 90b are connected to wiring substrates through wires 102, respectively, and sealed with a resin 103.

Figure 48:
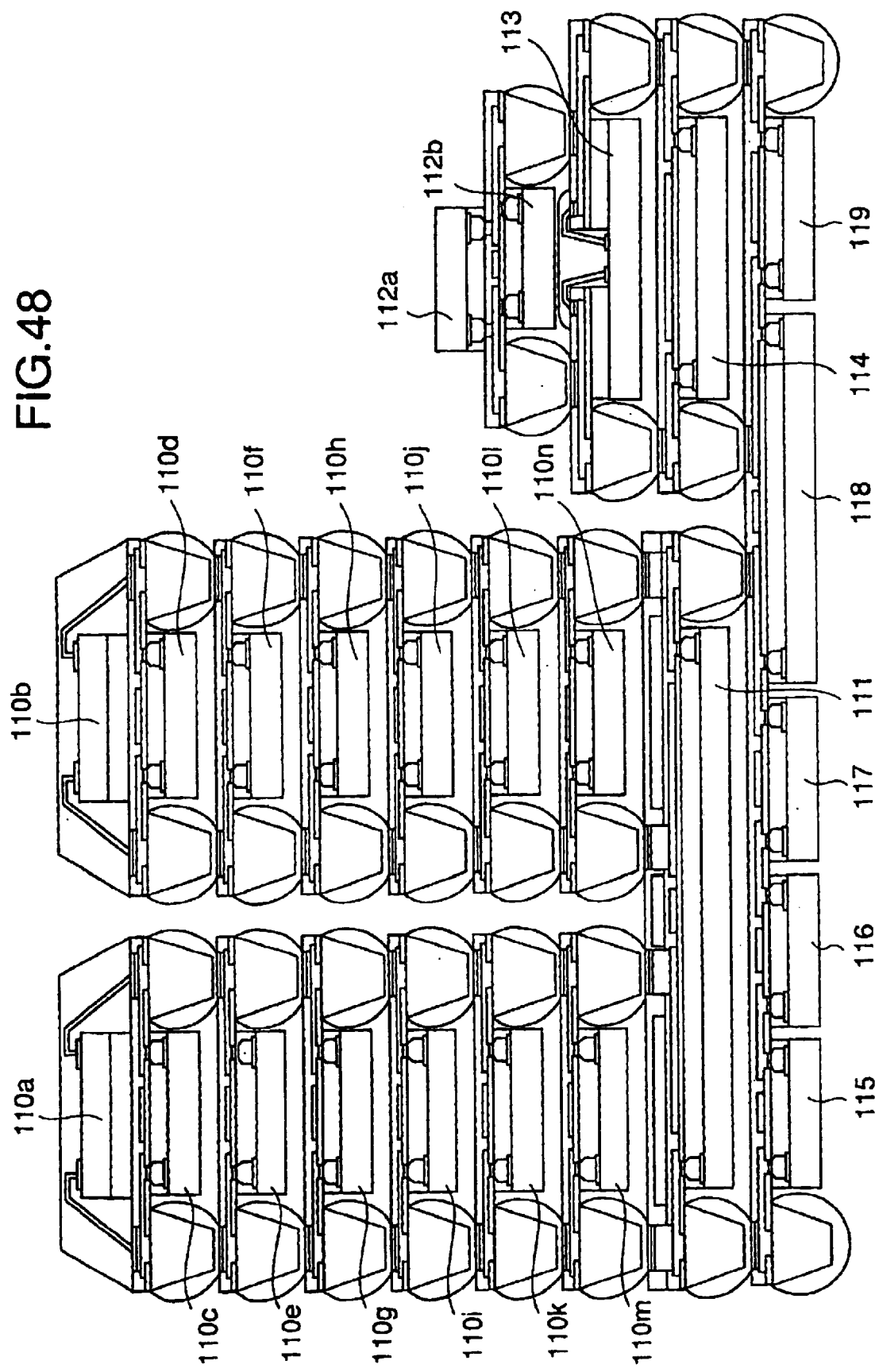
FIG. 48 is a sectional view showing an application example wherein a plurality of wiring substrates are assembled.

FIG. 48 to a sectional view showing an application example wherein a plurality of wiring substrates are assembled at 8-steps. As shown in FIG. 48, as LSI chips, Dynamic Random Access Memories (DRAMs) 110a, 110b, 110c, 110d, 11e, 110f, 110g, 110h, 110i, 110j, 100k, 100l, 100m, a DRAM controller 111, a Static RAMs (SRAMs) 112a, 112b, a flash memory 113, a Digital Signal Processor (DSP) 114, a serial interface 115, a timer 116, a bus controller 117, a Moving Picture Experts Group (MPEG) 118, an IEEE 1394 serial interface 119 are provided, and each wiring substrate has lower metal bumps and higher metal bumps.

As described above, in the wiring substrate of the present invention, the single layer wiring or multilayered wiring having the wiring films to formed by electroplating on the base made of a metal through the insulating film, and the base 1 is selectively etched. Therefore, the base can be used to construct the wiring substrate, and further to secure the mechanical strength of the wiring substrate.

In the fabricating method of the wiring substrate of the present invention, the single layer wiring or multilayered wiring having the wiring films is formed by electroplating on the base made of a metal through the insulating film, and the base 1 is selectively etched. Thus, the above wiring substrate can be obtained.

In the wiring substrate, the first insulating film having the openings is formed on the metal base, the single layer wiring or multilayered wiring having the wiring films the lower portions of which comprise the metallized film (conductive film) is formed on the first insulating film including the openings, the second insulating film is formed on the region for forming the wiring except for a certain portion, and the base is selectively removed (etched) to partially expose the back surfaces of the wiring films. Therefore, the base and the wiring films can be electrically connected to each other through the openings, the base may have function of wiring or other function, and the formation of the openings does not require any special work such as drilling and molding processing.

Also, the wiring substrate has the wiring films the lower portions of which comprise the metallized film on the first insulating film. Therefore, the wiring films may be formed by electroplating that to superior in terms of film quality stability, etc., film quality of the wiring films may be improved, and the formation may be sped up.

In the wiring substrate, the base is partially removed (selectively etched) so as to form the ground layer, power source plane, terminals, dam and/or reinforcement portion, and the openings formed in the first insulating film are, by being filled with the wiring films, act as connecting means to connect the wiring films to the ground layer, power source plane and/or terminals which are made from the base Therefore, the ground layer and/or power source plane are not needed to be particularly formed. If the dam and/or reinforcement portion is formed from the base, it is not necessary to form and pattern a layer specialized for forming the dam and/or reinforcement portion.

In the wiring substrate, the metallized film is made of a wiring film material and a material suitable for selective etching. Therefore, when the base is selectively etched, the metallized film can function as an etching stopper for inhibiting etching of the wiring films, without requiring formation of a new film to be used for etching stopper.

In the wiring substrate, the partially removed (selectively etched) base forms into the terminals for connecting with other member, making it possible to replace the ball electrodes with the terminals made of the base. Alternatively, the terminals may be used as terminals for flip chip bonding of the electrodes of the LSI chip so that, for example, the ball electrodes formed on the surface opposite to the base side of the wiring substrate are used as the connection terminals with other member.

In the wiring substrate, the terminals are form d in a portion of the region for forming the wiring which is formed by removing the second insulating film, the holes to be filled with buffer are formed at positions in the base which correspond to the terminals, and the buffer is filled in the holes to be filled with buffer. Therefore, the impact applied in connecting the terminals to, for example, the electrodes of the LSI chip can be absorbed by the buffer, leading to prevention of producing a crack in the LSI chip or the like from the impact in connecting.

In the wiring substrate, on the region for forming the wiring, portions where the second insulating film is partially removed serve as the openings for forming bump electrode at which the wiring is partially exposed, and the bump electrodes to be bonded to the LSI chip by flip chip bonding are formed in the openings for forming bump electrodes. Thus, the LSI chip may be mounted at the bump electrodes by flip chip bonding.

In the wiring substrate, on the region for forming the wiring, portions where the second insulating film is partially removed serve as the openings for forming bump electrodes at which the wiring is partially exposed, and the bump electrodes to be connected to other member are formed in the openings for forming bump electrodes. Thus, a wiring member may be connected at the bump electrodes on one side of the wiring substrate which is opposite to the base.

In the fabricating method of the wiring substrate, the first insulating film having the openings is form d on the base made of a metal, the single layer wiring or multilayered wiring having the wiring films the lower portions of which comprise the metallized film is formed on the first insulating film including the openings, the second insulating film is formed on the region for forming the wiring except for a certain portion, and the base is selectively etched to expose the back surfaces of the wiring films. Thus, by this fabricating method, the wiring substrate may be obtained.

In the fabricating method of the wiring substrate, the back surfaces of the wiring films are exposed by the selective etching of the base, and the exposed surfaces are then plated with a noble metal. Therefore, the noble metal plating is formed only on the back surfaces of the wiring films to enhance their connectivity and to avoid waste of the noble metal, i.e., to save useless noble metal stuck to other portions, thereby further reducing raw material cost.

In the fabricating method of the wiring substrate, the metallized film formed by metallizing treatment is made of a metal forming the wiring films and of a metal suitable for selective etching and, then, only the metallized film is selectively removed. Namely, the base is selectively etched using the metallized film as an etching stopper. Therefore, when the base is selectively etched, there is no need to add a process of forming an etching stopper for inhibiting the wiring films from being etched.

In the wiring substrate, the first insulating film having the openings is formed on the base made of a metal, the single layer wiring or multilayered wiring having the wiring films the lower portions of which comprise the metallized film is formed on the first insulating film including the openings, the second insulating film having the openings for forming bump electrode is formed on the region for forming the wiring, the bump electrodes made of an electroplating film are formed in the openings for forming bump electrodes, and the terminals to be connected to other member are formed from the base. Therefore, the LSI chip may be mounted to the wiring substrate at, for example, the bump electrodes, and the wiring substrate go may be mounted on a wiring member at the terminals made from the base.

In the fabricating method of the wiring substrate, the first insulating film having the openings is formed on the base made of a metal, the single layer wiring or multilayered wiring having the wiring films the lower portions of which comprise the metallized film is formed on the first insulating film including the openings, the second insulating film having the openings for forming bump electrodes is formed on the region for forming the wiring, the bump electrodes made of an electroplating film are formed in the openings for forming bump electrode, and the base is selectively etched from its back surface side to form the terminals to be connected to other member. Thus, by this fabricating method, the wiring substrate may be obtained. Also, the wiring substrate has the wiring films the lower portions of which comprise the metallized film (conductive film). Therefore, the wiring films may b formed by electroplating that is superior in terms of film quality stability, etc., film quality of the wiring films may be improved, and the formation may be sped up.

In the wiring substrate, the first insulating film having the openings is formed on the base made of a metal, the single layer wiring or multilayered wiring having the wiring films is formed on the first insulating film including the openings, the second insulating film having the openings for connection is formed on the region for forming the wiring, and the terminals to be connected to other member are formed from the base. Therefore, the connection with, for example, the electrodes of the LSI chip may be made at the openings for connection of the wiring, and connection with other member may be made at the terminals.

In the fabricating method of the wiring substrate, the first insulating film having the openings is formed on the base made of a metal, the single layer wiring or multilayered wiring having the wiring films is formed on the first insulating film including the openings, the second insulating film having the openings for connection is formed on the region for forming the wiring, and the terminals to be connected to other member are formed from the base. Thus, by this fabricating method, the wiring substrate may be obtained.

In the wiring substrate, the lower portions of the wiring films on the first insulating film and on the base with openings are mad of a material that is suitable for selective etching of the base and capable of being joined to the LSI chip by micro joining. Therefore, the wiring films may be formed by electroplating that is superior in terms of film quality stability, etc., film quality of the wiring films may be improved, and the formation may be sped up. At the same time, micro joining may be made without adding a process required merely for preparing micro joining with the LSI chip.

In the fabricating method of the wiring substrate, the first insulating film having the openings is formed on the base made of a metal, the single layer wiring or multilayered wiring having the wiring films is formed on the first insulating film including the openings, the second insulating film having the openings for connection is formed on the region for forming the wiring, and the terminals to be connected to other member are formed from the base. Thus, by this fabricating method, the wiring substrate may be obtained.

In the wiring substrate, the base forms into the ground layer, power source plane, and/or reinforcement portion and, hence, it is not necessary to form a layer and a member specialized for forming the ground layer, power source plane, and/or reinforcement portion.

In the wiring substrate, the first insulating film having the openings is formed on the metal base, the single layer wiring or multilayered wiring having the wiring films is formed on the first insulating film including the openings, the second insulating film having the openings for forming bump electrodes is formed on the region for forming the wiring, and the stiffeners are formed from the base. Therefore, post-attachment of the stiffeners is not necessary, and the positioning of the stiffeners may be carried out with machining accuracy in the selective etching of the base, enhancing the positioning accuracy.

In the fabricating method of the wiring substrate, the first insulating film having the openings is formed on the base made of a metal, the single layer wiring or multilayered wiring having the wiring films is formed on the first insulating film including the openings, the second insulating film having the openings for forming bump electrode is formed on the region for forming the wiring, the bump electrodes are formed in the openings for forming bump electrode, and the base is selectively etched from its back surface to form the device holes, forming the stiffeners. Thus, by this fabricating method, the wiring substrate may be obtained. Therefore, post-attachment of the stiffeners is not necessary, and the positioning of the stiffeners may be carried out with machining accuracy in the selective etching of the base, enhancing the positioning accuracy.

In the wiring substrate, the first insulating film having the openings is formed on the base made of a metal, the single layer wiring or multilayered wiring having the wiring films the lower portions of which comprise the metallized film is formed on the first insulating film including the openings, the second insulating film having the openings for forming bump electrode is formed on the region for forming the wiring, the bump electrodes made of an electroplating film are formed in the openings for forming bump electrode, the bas is partially thinned to form the wiring films from the thinned base, and another insulating film having the openings for forming bump electrode is formed on the thinned wiring films. Thus, the wiring may be formed also from the thinned portion of the base.

Therefore, multilayered wiring substrate may obtain even more layers, enhancing integrated density of the wiring substrate.

In the fabricating method of the wiring substrate, the first insulating film having the openings is formed on the base made of a metal, the single layer wiring or multilayered wiring having the wiring films the lower portions of which comprise the metallized film is formed on the first insulating film including the openings, the second insulating film having the openings for forming bump electrodes is formed on the region for forming the wiring, the bump electrodes made of an electroplating film are formed in the openings for forming bump electrode, the base is half-etched from its back surface so as to be partially thinned, the thinned portion of the base is selectively etched to form the wiring films, and another insulating film having the openings for forming bump electrodes is formed on the wiring films formed from the thinned portion of the base. Thus, by this fabricating method, the wiring substrate may be obtained.

In the wiring substrate, the first insulating film having the openings is formed on the base made of a metal, the single layer wiring or multilayered wiring having the wiring films the lower portions of which comprise the metallized film is formed on the first insulating film including the openings, the second insulating film having the openings for forming bump electrode is formed on the region for forming the wiring, the bump electrodes made of an electroplating film and connected to other member are formed in the openings for forming bump electrode, and the terminals connected to the LSI chip are formed from the base. Thus, the LSI chip may be bonded at the terminals by flip chip bonding, and connected at the bump electrodes to other member.

In the fabricating method of the wiring substrate, the first insulating film having the openings is formed on the metal base, the single layer wiring or multilayered wiring having the wiring films the lower portions of which comprise the metallized film is formed on the first insulating film including the openings, the second insulating film having the openings for forming bump electrode is formed on the region for forming the wiring, the bump electrodes made of an electroplating film and connected to other member are formed in the openings for forming bump electrode, and the base is selectively etched to form at least the terminals connected to the LSI chip. Thus, by this fabricating method, the wiring substrate may be obtained.

In the wiring substrate, the first insulating film having the openings is formed on the metal base, the single layer wiring or multilayered wiring having the wiring films is formed on the first insulating film including the openings, the second insulating film having the openings for connection is formed on the region for forming the wiring, the bump electrodes are formed in the openings for connection, the base is selectively etched to partially expose the wiring films, and the LSI chip is fixed to the back surface of the base that the electrodes of the LSI chip are bonded to the exposed surface of the wiring films. Therefore, it is possible to obtain the wiring substrate in which the electrodes of the LSI chip can be led through the wiring films and the bump electrodes.

In the wiring substrate, the holes to be filled with buffer are formed at positions in the base which correspond to the bump electrodes, and the buffer is filled in the holes to be filled with buffer. Therefore, the impact applied in connecting the terminals to, for example, other member can be absorbed by the buffer, leading to prevention of producing a crack in the LSI chip, or the like, from the impact in connecting.

In the wiring substrate, the first insulating film having the openings is formed on the metal base, the single layer wiring or multilayered wiring having the wiring films is formed on the first insulating film including the openings, the second insulating film having the openings for connection is formed on the region for forming the wiring, the bump electrodes are formed in the openings for connection, the base is selectively etched to form the device hole, thereby partially exposing the wiring films, the LSI chip is positioned in the device hole, and each electrode of the LSI chip is bonded to the partially exposed wiring films in the device hole. Therefore, the wiring substrate of CSP type may be constructed. Further, the portions of the base corresponding to the circumference of the device hole can function as the stiffeners without modification, so that the need for post-attachment of any stiffener is eliminated, and positioning of the stiffeners can be made with the machining accuracy in the selective etching of the base, enhancing the positioning accuracy.

In the wiring substrate, the first insulating film having the openings is formed on the metal base, the single layer wiring or multilayered wiring having the wiring films is formed on the first insulating film including the openings, the second insulating film having the openings for connection is formed on the region for forming the wiring, the bump electrodes are formed in the openings for connection, the base is selectively etched to partially expose the wiring films, the LSI chip is bonded to the back surface of the base by die bonding, and the electrodes of the LSI chip are bonded to the exposed portion of the wiring films by wire bonding. Therefore, it is possible to obtain the wiring substrate in which the electrodes of the LSI chip can be led through the wires, the wiring films and the bump electrodes.

In the wiring substrate, the holes to be filled with buffer are formed at positions in the base which correspond to the bump electrodes, and the buffer is filled in the holes to be filled with buffer. Therefore, the impact applied in connecting the terminals to, for example, other member can be absorbed by the buffer, leading to prevention of producing a crack in the LSI chip, or the like, from the impact in connecting.

In the wiring substrate, the base made of a metal is selectively etched to form the terminals connected to other member, the insulating film having the openings is formed on the terminals made from the base, the single layer wiring or multilayered wiring having the wiring films the front ends of which are stuck out from the regions for forming the terminals as a result of the selective etching of the base is formed on the insulating film including the openings, the LSI chip is bonded by die bonding to the wiring films at the surface portion through the insulating material, and the stuck out portions of the wiring films are bonded to the electrodes on the outer periphery of the surface portion of the LSI chip. Therefore, it is possible to obtain the wiring substrate in which the electrodes on the outer periphery of the surface of the LSI chip can be led out through the wiring films and the terminals made from the base.

In the wiring substrate, the base made of a metal is selectively etched to form the terminals connected to other member, the insulating film having the openings is formed on the terminals made from the base, the single layer wiring or multilayered wiring having the wiring films of which the portions connected with the LSI chip are exposed is formed on the insulating film including the openings, the LSI chip is bond d by die bonding to the wiring films at the back surface portion through the insulating material, and the exposed portions of the wiring films are bonded to the electrodes on the surface portion of the LSI chip by wire bonding Therefore, it is possible to obtain the wiring substrate in which the electrodes on the outer periphery of the surface of the LSI chip can be led out through the wires, the wiring films and the terminals made from the base.

In the wiring substrate, the base made of a metal is selectively etched to form the terminals connected to other member, the insulating film having the openings is formed on the terminals made from the base, the single layer wiring or multilayered wiring having the wiring films of which the internal ends connected with the LSI chip are exposed is formed on the insulating film including the openings, and the electrode of the LSI chip are bonded to the internal end surfaces of the wiring films. Therefore, it is possible to obtain the wiring substrate in which the electrodes of the LSI chip can be led out through the wiring films and the terminals made from the base.

In the wiring substrate, the base made of a metal is selectively etched to form the terminals connected to other member, the insulating film having the openings is formed on the terminals made from the base, the single layer wiring or multilayered wiring having the wiring films that are connected to the terminals through the openings is formed on the insulating film including the openings, the second insulating film having the openings for forming bump electrode is formed on the wiring, the bump electrodes are formed in the openings for forming bump electrode, and the electrodes of the LSI chip are connected to the bump electrodes. Therefore, it is possible to obtain the wiring substrate in which the electrodes of the LSI chip can be led out through the bump electrodes, the wiring films and the terminals made from the base.

In the wiring substrate, the base made of a metal is selectively etched to form the terminals connected to other member, the insulating film having the openings is formed on the terminals made from the base, the single layer wiring or multilayered wiring having the wiring films that are connected to the terminals through the openings is formed on the insulating film including the openings, the second insulating film having the openings for forming bump electrode is formed on the wiring, the bump electrodes are formed in the openings for forming bump electrode, the electrodes of the LSI chip are connected to the bump electrodes, and the space between the LSI chip and the second insulating film, or both the second insulating film and the LSI chip is/are sealed with resin. Therefore, it is possible to obtain the wiring substrate in which the electrodes of the LSI chip can be led out through the bump electrodes, the wiring films and the terminals made from the base, and which can be sealed with resin.

In the wiring substrate, the base made of a metal is selectively etched to form the terminals connected to other member, the dam positioned between the adjacent regions where the LSI chips are arranged, and another dam positioned on the outer peripheral portions of the substrate, the first insulating film having the openings is formed on the terminals made from the base, the single layer wiring or multilayered wiring having the wiring films that are connected to the terminals through the openings is formed on the insulating film including the openings, the second insulating film having the openings for forming bump electrode is formed on the wiring, the bump electrodes are formed in the openings for forming bump electrode, a plurality of the LSI chips are mounted by connecting their electrodes to the terminals made from the base, and, when the space between the LSI chip and the second insulating film or both the second insulating film and the LSI chip is/are sealed with resin, the dams stop the resin. Therefore, it is possible to obtain the wiring substrate in which the electrodes of the plural LSI chips can be led out through the wiring films and the bump electrodes, and which can be sealed with resin, while it can dam up the resin by means of the dams.

In the wiring substrate, the insulating film having the openings is formed on the base, the single layer wiring or multilayered wiring having at least the wiring films formed on the insulating film including the openings is formed, the insulating film having the openings for forming bump electrode is formed on the wiring, the bump electrodes are formed in the openings for forming bump electrode, the base is selectively etched to form a plurality of LSI chip mounting regions, the LSI chips are mounted to the LSI chip mounting regions, and the respective electrodes of the LSI chips are bonded with the wires to the wiring films exposed by the selective etching of the base. Therefore, it is possible to obtain the wiring substrate in which the respective electrodes of the plural LSI chips can be led out through the wires, the conductive films, and the ball electrodes.

According to a wiring substrate of the present invention, single layer wiring films or multilayered wiring films are formed on one side (the front side) of an insulating resin film that has openings for communicating the upper to the lower, and formed on the other side (the back side) of this insulating resin film are two kinds of metal bumps that are connected to the wiring films through the openings and are different in height from each other. Therefore, LSI chips may be mounted to portions where the lower metal bumps are placed on both the front and back sides of the insulating resin film, enhancing the mounting density of the wiring substrate. According to this wiring substrate, the lower metal bumps serve as bumps for flip chip bonding, and the LSI chips are bonded to the lower metal bumps. Also, according to this wiring substrate, the LSI chips are disposed on one side of the resin film having the openings for communicating the upper to the lower, where the single layer wiring films or multilayered wiring films are formed.

According to a fabricating method of a wiring substrate of the present invention, first sold r films are selectively formed on one main surface of a base metal, a metal film is formed on the main surface of the base metal including the solder films, an insulating film having openings for communicating the upper to the lower is formed on the metal film, the openings being placed at positions corresponding to metal bumps to be formed later, single layer wiring films or multilayered wiring films are formed on the insulating film, second solder films are formed on the other main surface of the base metal at positions where higher metal bumps are to be formed, the base metal is then etched from the other main surface side using the second solder films as masks, and the metal film is etched, as well, using as masks the second solder films and the first solder films, thereby forming higher metal bumps made from the metal film and the base metal and forming lower metal bumps made from the metal film. Thus, the wiring substrate of the present invention can be obtained. By applying reflowing treatment on the first and second solder films after forming those metal bumps, the higher metal bumps and the lower metal bumps are covered with solder of the solder films, so that the solder may be utilized as solder bumps.

What is claimed is:

1. A method for fabricating a wiring substrate comprising the steps of:

forming an insulating film on a metal base having openings on the metal base at positions corresponding to metal bumps to be formed later;

forming at least one layer of wiring on the base made of a metal through the insulating film, the layer of wiring having a wiring film formed thereon by electroplating; and selectively etching the base, wherein the wiring layer formed through the insulating film is in contact with the metal base.

2. The method of claim 1, wherein the wiring layer formed through the insulating film is in contact with the insulating film where there are no openings in the insulating film.

3. The method of claim 1, wherein the wiring layer is formed in the area of the openings on the insulating film.

4. A method for fabricating a wiring substrate comprising the steps of:

forming an insulating film on a metal base having openings on the metal base at positions corresponding to metal bumps to be formed later;

forming at least one layer of wiring on the base made of a metal through the insulating film, the layer of wiring having a wiring film formed thereon by electroplating; and selectively etching the base, wherein the wiring film functions as an etching stopper.

* * * * *